United States Patent [19]
Matsuyama

[11] Patent Number: 6,106,689
[45] Date of Patent: Aug. 22, 2000

[54] PROCESS FOR FORMING ZINC OXIDE FILM AND PROCESSES FOR PRODUCING SEMICONDUCTOR DEVICE SUBSTRATE AND PHOTO-ELECTRICITY GENERATING DEVICE USING THE FILM

[75] Inventor: Jinsho Matsuyama, Kyoto-fu, Japan

[73] Assignee: Canon Kabushiki Kaisha, Tokyo, Japan

[21] Appl. No.: 09/009,738

[22] Filed: Jan. 20, 1998

[30] Foreign Application Priority Data

Jan. 20, 1997 [JP] Japan .................................. 9-007558

[51] Int. Cl.[7] .............................. C25D 9/00; C25D 5/34; C23D 28/00; B05D 1/18; B05D 3/12

[52] U.S. Cl. ...................... 205/333; 205/206; 205/210; 205/199; 205/200; 205/201; 205/164; 205/167; 427/430.1; 427/435; 427/322; 427/328; 427/307; 427/436; 427/316; 427/318; 427/319

[58] Field of Search ............................ 205/333, 206, 205/210, 199, 200, 201, 164, 167; 427/430.1, 435, 322, 328, 307, 436, 316, 318, 319

[56] References Cited

U.S. PATENT DOCUMENTS 5,800,632  9/1998  Arao et al. ............................. 136/258

FOREIGN PATENT DOCUMENTS 8-217443  8/1996  Japan .

OTHER PUBLICATIONS

Inoue, Y., et al. "Optical Confinement Effect in a–SiGe Solar Cells on Stainless Steel Substrates," *Preprint (29p–MF–2) for the 51–th Academic Lecture of The Japan Society of Applied Physics*, p. 747, Autumn, 1990. No month available.

Sannomiya, H., et al., "a–SiC/a–Si/a–SiGe Multi–Bandgap Stacked Solar Cells with Bandgap Profiling," *Technical Digest of the International*, PVSEC–5, Kyoto, Japan, p. 381, 1990. No month available.

Izaki, Masanobu, et al., "Electrolyte Optimization for Cathodic Growth of Zinc Oxide Films," *J. Electrochem Society, Inc.*, vol. 143, Mar. 1996, L53.

*Primary Examiner*—Kathryn Gorgos
*Assistant Examiner*—Edna Wong
*Attorney, Agent, or Firm*—Fitzpatrick, Cella, Harper & Scinto

[57] ABSTRACT

A process for forming a zinc oxide film including immersing an electroconductive substrate having a surface including a plurality of linear projections in an aqueous solution containing at least nitrate ions and zinc ions to form a zinc oxide film on the electroconductive substrate by a liquid-phase deposition. The plurality of linear projections may preferably provide an uneven surface which has a center-line average surface roughness Ra(X) of 15–300 nm when scanned in a direction parallel to the linear projections, a center line average surface roughness Ra(Y) of 20–600 nm when scanned in a direction perpendicular to the linear projections, and an Ra(X)/Ra(Y) ratio of at most 0.8. The thus formed zinc oxide film is provided with an uneven surface suitable for an optical-confinement layer of a photo-electricity generating device excellent in photoelectric performances.

49 Claims, 5 Drawing Sheets

PROCESS FOR FORMING ZINC OXIDE FILM AND PROCESSES FOR PRODUCING SEMICONDUCTOR DEVICE SUBSTRATE AND PHOTO-ELECTRICITY GENERATING DEVICE USING THE FILM

FIELD OF THE INVENTION AND RELATED ART

The present invention relates to a process for forming a zinc oxide film through deposition in liquid phase so as to have an uneven surface suitable for obtaining a light-confining effect and relates to processes for producing a substrate for a semiconductor device and an photo-electricity generating device using the zinc oxide film.

In a process for producing an electro-electricity generating device, there has been known that a reflection layer of, e.g., metal is formed on the back side of an semiconductor layer in order to improve a light-collection efficiency of the photo-electricity generating device on a long wavelength. Further, there has also been known that a transparent electroconductive layer having an uneven surface is formed between the reflection layer and the semiconductor layer to obtain a light-confining (optical confinement) effect that an optical distance (optical path) of reflected light is prolonged to obtain an effect of suppressing an excessive current flowing at the time of an occurrence of a shunt phenomenon. As the transparent electroconductive layer, there has been widely used a zinc oxide (ZnO) film formed by sputtering.

More specifically, by the use of the reflection layer and the zinc oxide layer in combination, an increase in short circuit current based on the light-confining effect has been achieved as described in, e.g., "Optical confinement Effect in a-SiGe solar cells on Stainless Steel Substrates", Preprint (29p-MF-2) for the 51-th Academic Lecture of The Japan Society of Applied Physics, p747, Autumn, 1990 or "P-IA-15 a-SiC/a-Si/a-SiGe Miti-Bandgap Stacked Solar Cells with Bandgap Profiling" Sannomiya et al., Technical Digest of the International PVSEC-5, Kyoto, Japan, p381, 1990.

Further, there have been reported that the zinc oxide film is formed by electrolysis (electrodeposition) in an aqueous solution containing zinc ions ($Zn^{2+}$) and nitrate ions ($NO_3^-$) as in "Electrolyte Optimization for Cathodic Growth of Zinc Oxide Films", M. IZAKI and T. Omi, J. Electrochem. Soc., Vol. 143, March 1996, L53 or Japanese Laid-Open Patent Application (JP-A) 8-217443.

However, it has been found that when a zinc oxide film is formed on a conventionally used stainless steel substrate surface-flattened by polishing the resultant zinc oxide film causes fluctuation or changes of its properties within a formed surface in terms of a film thickness, a particle size of ZnO crystal, crystal orientation properties and an electroconductivity. Further, in the resultant zinc oxide film, remarkable anomalous growth of the deposited (precipitated) crystal of ZnO has been confirmed, thus leading to defects of a photo-electricity generating device using the zinc oxide film to lower a production yield thereof.

SUMMARY OF THE INVENTION

In view of the above problems, an object of the present invention is to provide a process for forming a zinc oxide film on an electroconductive substrate having a particular uneven surface by a liquid-phase deposition (electrodeposition), whereby adhesive properties between the zinc oxide film and an underlying electroconductive substrate are improved and an average particle size of the deposited crystal is increased.

Another object of the present invention is to provide a process for forming a zinc oxide film providing a high irregular reflectance, suitable for application to a light-confining layer of a photo-electricity generating device.

A further object of the present invention is to provide a process for producing a substrate for a semiconductor device (element) including the zinc oxide film-forming process.

A still further object of the present invention is to provide a process for producing a photo-electricity generating device, including the zinc oxide film-forming process, with a high production yield and reliability and capable of improving light absorption of an semiconductor layer.

According to the present invention, there is provided a process for forming a zinc oxide film, comprising:

immersing an electroconductive substrate having a surface including a plurality of linear projections in an aqueous solution containing at least nitrate ions and zinc ions to form a zinc oxide film on the electroconductive substrate by a liquid-phase deposition.

According to the present invention, there is also provided a process for producing a substrate, for a semiconductor device, comprising an electroconductive substrate and a zinc oxide film formed thereon, said process comprising:

immersing an electroconductive substrate having a surface including a plurality of linear projections in an aqueous solution containing at least nitrate ions and zinc ions to form a zinc oxide film on the electroconductive substrate by a liquid-phase deposition.

According to the present invention, there is further provided a process for producing a photo-electricity generating device, comprising:

forming a zinc oxide film on an electroconductive substrate by immersing the electroconductive substrate having a surface including a plurality of linear projections in an aqueous solution containing at least nitrate ions; and forming a semiconductor layer on the zinc oxide film.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A–1D are respectively a schematic illustration of an electroconductive substrate having a plurality of linear projections used in the present invention; wherein FIG. 1A shows an embodiment of linear projections arranged in a straight-line shape, FIG. 1B shows an embodiment of linear projections arranged in a curved shape, FIG. 1C shows an embodiment of linear projections arranged in a spiral shape, and FIG. 1D shows an embodiment of linear projections including first linear projections and second linear projections arranged perpendicular to the first linear projections and each of the first and second linear projections being arranged in a straight-line shape.

DESCRIPTION OF THE PREFERRED EMBODIMENTS

Figure 1A:
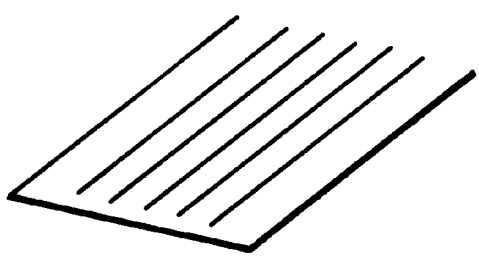

In the present invention, the plurality of linear projections provides the electroconductive substrate with an uneven surface (pattern) including a projection portion comprising the linear projections and a recess portion.

The uneven surface of the electroconductive substrate may preferably have a center-line average surface roughness (Ra(X) of 15–300 nm when scanned in a direction (X direction) parallel to the linear projections and a center-line average surface roughness Ra(Y) of 20–600 nm when scanned in a direction (Y direction) perpendicular to the linear projections. The Ra(X) and Ra(Y) may preferably provide Ra(X)/Ra(Y) ratio of at most 0.8.

The center-line average roughness Ra herein is generally defined by the following equation (I).

$$Ra = 1/L \times \int_0^L |f(x)| dx \quad (I)$$

In the equation (I), L is a measured length (e.g., 400 μm and including 5 measuring points per 1 μm) in a given direction, and f(x) is corresponding to a height based on the center line of the projection and recess portions (uneven surface) at a given position of the substrate.

The surface roughness may be expressed by a maximum height Rmax. However, in the present invention, it has been found that the center-line average surface roughness Ra (Ra(X), Ra(Y)) may suitably be used since the Ra has a high correlation with the yield and photoelectric characteristics of a photo-electricity generating device. This may be attributable to the fact such that when even only one large sized irregularity (projection or recess) is present at the surface of the electroconductive substrate, the Rmax becomes large accordingly and on the other hand, the Ra provides a more average evaluation for the uneven surface of the electroconductive substrate used in the present invention. Herein for an uneven surface comprising a plurality of simple triangle irregularities (projection and recess portions), it is considered that the Rmax is about four times the Ra. On the other hand, for the uneven surface including the linear projections in the present invention, the Rmax is generally about five times the Ra in most cases.

In the present invention, when the center-line average surface roughness Ra(X) exceeds 300 nm, the residual uneven surface is liable to include projection and recess portions (irregularities) substantially arranged in a conventional pyramid shape even in the case of including the linear projections, so that a photo-electricity generating device prepared by using the electroconductive substrate having such an uneven surface has been accompanied with problems including a lowering in production yield due to a shunt phenomenon and decreases in an open circuit voltage (Voc) and a fill factor (FF) in some cases.

These problems have similarly be found in the case where the Ra(Y) exceeds 600 nm since the resultant uneven surface have remarkably large irregularities although the uneven surface includes the linear projections.

On the other hand, when the Ra(X) is smaller than 15 nm, a peeling phenomenon has been observed between the electroconductive substrate and the zinc oxide film formed thereon in some cases even if the resultant uneven surface has the linear projections. Further, when the Ra(Y) is smaller than 20 nm, the resultant uneven surface has caused the peeling phenomenon and/or a lowering in a short circuit current (Isc) due to a decreased irregular (diffuse) reflectance in some cases since the electroconductive substrate having such an uneven surface substantially has a mirror surface.

In the case where an electroconductive substrate having an uneven surface including linear projections has minute pits or depressions arranged in a direction parallel to the linear projections (in the X direction), the resultant Ra(X)/Ra(Y) ratio exceeds 0.8 in some cases. As a result, the photo-electricity generating device including such an electroconductive substrate has been accompanied with problems including lowerings in weather resistance and the production yield due to the shunt phenomenon and also decreases in the open circuit voltage (Voc) and the fill factor (FF).

In the present invention, by setting the Ra(X) and the Ra(Y) so as to satisfy the conditions including the Ra(X) being 15–300 nm, the Ra(Y) being 20–600 nm and the Ra(X)/Ra(Y) ratio being at most 0.8; a leakage (shunt) current of the resultant photo-electricity generating device can effectively be suppressed to further improve an irregular reflectance at the backside thereof and adhesive properties between the electroconductive substrate and the zinc oxide film formed on the electroconductive substrate while retaining the yield of the photo-electricity generating device production.

Hereinbelow, the substrate for a semiconductor device produced by the process of the present invention will be described with reference to FIGS. 1A–1D.

The substrate principally includes the above-described electroconductive substrate having the uneven surface including the plurality of the linear projections, and the zinc oxide film formed on the electroconductive substrate.

Figure 1B:
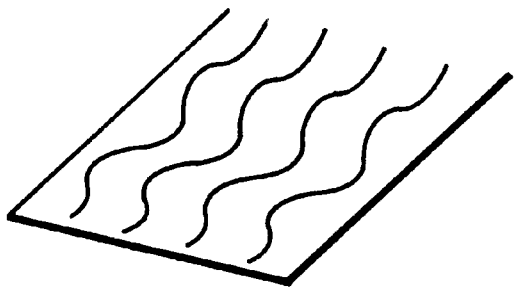
Figure 1C:
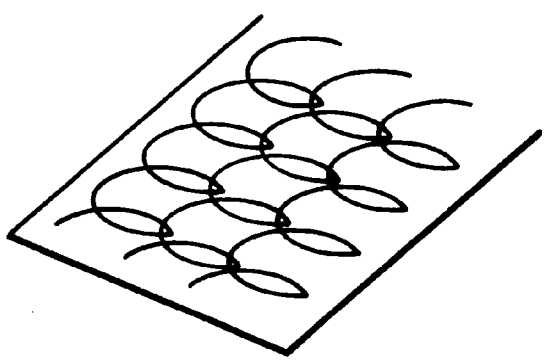
Figure 1D:
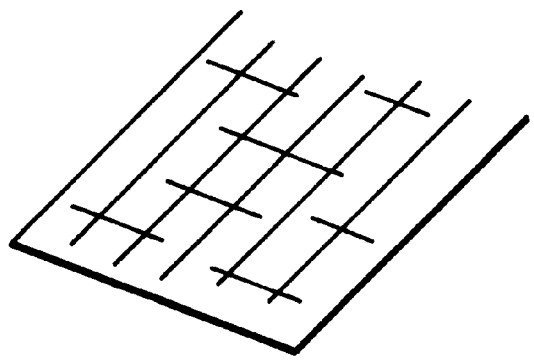

FIGS. 1A–1D are schematic illustrations showing shapes or patterns of the linear projections for the semiconductor device, respectively; wherein FIG. 1A shows a linear projection pattern in a straight-line shape, FIG. 1B shows a linear projection pattern in a curve shape, FIG. 1C shows a linear projection pattern in a spiral (or helical) shape and FIG. 1D shows a linear projection pattern in a first straight-line shape and a second (minute) straight-line shape arranged perpendicular to the first straight-line shape. The uneven surface pattern shown in FIGS. 1B and 1C may generally include curved portions providing a radius of curvature of at least 1 mm.

When the linear projections are scanned in the X direction (the direction parallel thereto) to obtain the center-line average surface roughness Ra(X) and are scanned in the Y direction (the direction perpendicular thereto) to obtain the center-line average surface roughness Ra(Y), the uneven surface of the electroconductive substrate including the linear projections may preferably have an Ra(X) of 15–300 nm, more preferably 20–200 nm, particularly 25–150 nm, and may preferably have an Ra(Y) of 20–600 nm, more preferably 40–400 nm, particularly 60–300 nm. Further, the uneven surface of the electroconductive substrate may preferably have an Ra(X)/Ra(Y) ratio of at most 0.8, more preferably at most 0.6, particularly at most 0.4.

By setting the Ra(X), Ra(Y) and Ra(X)/Ra(Y) in the above preferred ranges, it is possible to further enhance the effects of the present invention (such as improvements in photoelectric characteristics, adhesive properties, production yield and irregular reflectance).

The linear projections may preferably have a pitch (a distance between adjacent linear projections) of 0.5–20 μm, more preferably 1–15 μm, particularly 2–10 μm, thus enhancing the above effects.

Referring to FIG. 1D, each second (minute) linear projection may preferably have a length of at most 20 μm, more preferably at most 15 μm, particularly at most 10 μm, thus enhancing the above effects.

The substrate for the semiconductor device may comprise a single crystal material or a non-single crystal material, which is either electroconductive or electrically insulative. In any case, it is desired for the substrate to be constituted by an appropriate material which is not readily deformed or distorted and has a sufficient physical strength although the substrate may have transparency or opacity to light.

Specifically the substrate may include a metal selected from the group consisting of Fe, Ni, Cr, Al, Mo, Au, Nb, Ta, V, Ti, Pt and Pb; an alloy selected from the group consisting of alloys of these metals such as brasses and stainless steels; and a material selected from the group consisting of composites of these alloys.

Alternatively, the substrate may include a film or sheet or heat resistant synthetic resins, such as polyester, polyethylene, polycarbonate, cellulose acetate, polypropylene, polyvinyl chloride, polyvinyliene chloride, polystyrene, polyamide, polyimide, and epoxy resin; and composites of these films or sheets with a glass fiber, carbon fiber, boron fiber or metallic fiber.

The substrate may be constituted by thin plates made of the above-mentioned metals surface-coated with a metal thin film made of a different metal and/or an electrically insulative thin film of $SiO_2$, $Si_3N_4$, $Al_2O_3$ or AlN by sputtering, vacuum deposition, or plating; the above-mentioned synthetic resin sheets surface-coated with an appropriate metal thin film and/or an electrically insulative thin film of $SiO_2$, $Si_3N_4$, $Al_2O_3$ or AlN by sputtering, vacuum deposition, or plating; glass and ceramics.

Of the above descried materials, stainless steels are particularly excellent in processability (workability) and durability and in addition, they excel in suitability in forming the above-described uneven surface patterns thereon.

In the case where the substrate is constituted by the electroconductive material, it may be designed such that it serves also as an electric current outputting electrode. In the case where the substrate is constituted by the electrically insulative material, its surface on which a deposited (zinc oxide) film is to be formed is desired to have been subjected to an electroconductivity-imparting treatment with the use of a metal such as Al, Ag, Pt, Au, Ni, Ti, Mo, W, Fe, V, Cr, Cu, stainless steel, brass or nickel-chrome alloy; or a transparent and electrically conductive oxide material such as $SnO_2$, $In_2O_3$, ZnO or indium-tin oxide (ITO) by plating, vacuum deposition or sputtering so as to establish an electric current outputting terminal.

When the zinc oxide film is formed on the electrically insulating substrate, the zinc oxide film may preferably be formed by electroless deposition.

Even in the case where the substrate is constituted by the electroconductive material such as a metallic material, a metal layer composed of a metal different from the constituent metallic material of the substrate is desired to be disposed on the substrate surface on which the zinc oxide (deposited) film is formed for the purposes of improving the reflection of long wavelength light on the substrate surface and preventing the constituent elements of the substrate and those of the zinc oxide film from being mutually diffused.

In the case where the substrate is relatively transparent and constitutes a photo-electricity generating device which incident light enters from the substrate side, the transparent and electroconductive oxide film or the metal film may desirably be formed or deposited on the substrate in advance.

Depending on the purpose of the substrate, the substrate may have any shape, such as a plate or sheet-shape, an elongated belt-shape or a cylindrical shape, on which a smooth or uneven surface is provided. The thickness of the substrate may appropriately be determined so as to provide a desired photo-electricity generating device. When the photo-electricity generating device is required to have a flexibility or irradiated with light entering from the substrate side, the substrate may preferably be formed in a thickness as small as possible within the extent sufficiently exhibiting its functions. However, the thickness of the substrate is generally set to be at least 10 μm in view of productivity, handling properties and mechanical strength.

In the case of using the elongated electroconductive sheet substrate, the process for forming the zinc oxide film on the elongated sheet substrate is remarkably improved in production (process) speed and production costs with less fluctuation or change in characteristics of the zinc oxide film in a lengthwise direction of the sheet substrate, thus resulting in uniform characteristics for the photo-electricity generating device to further improve the production yield.

The formation of the uneven surface pattern on the substrate is conducted by an appropriate manner depending upon the kind of the constituent material of the substrate but can be employed such manners as will be described below.

In order to form the uneven surface pattern including the plurality of linear projections arranged in a straight-line shape or a curved shape, there can be used a manner by way of rolling, a manner by way of polishing, a manner by way of molding or a manner by way of etching. In these manners, annealing can be supplementarily used.

The manner by way of rolling is suitable in the case where the substrate is made of a metallic material. The rolling may include hot rolling and cold rolling. The cold rolling may be conducted by using a reversing type four rolls rolling mill, a sendzimir twenty rolls rolling mill, and a skinpass rolling mill. In the case of using the cold rolling, for instance, when the substrate is constituted by an austenitenic stainless steel, the uneven surface providing a desirable uneven surface pattern including the linear projections respectively arranged in a given direction on the substrate by way of 2D finishing, 2B finishing or BA finishing. Herein, the "2D finishing" means a surface finishing for a stainless steel according to JIS (Japan Industrial Standard) G 4305. Specifically, a stainless steel is, after cold rolling, subjected to heat treatment and acid-washing or similar treatment, optionally followed by light cold rolling through a matte surface roll, as desired. The "2B finishing" means another surface finishing for a stainless steel according to JIS G 4305. Specifically, a stainless steel is, after cold rolling subjected to heat treatment and acid-washing or similar treatment, followed by cold rolling for providing an appropriate polished surface.

In the following, description will be made of the manner of forming an uneven or irregular surface pattern comprising a plurality of linear projections according to the present invention on a surface of a stainless steel plate (as the electroconductive substrate) by way of rolling.

The process for the production of a stainless steel plate generally comprises a steel-making process, a hot rolling process, a cold rolling process, and a final process. Of these processes, the final process is the most important for the formation of the uneven surface pattern according to the present invention. By selecting optimum conditions for the final surface treatment by finish rolling, finish polishing and the like, the irregular surface pattern according to the present invention can be formed on the surface of the stainless steel in a desirable state.

In the steel-making process, a raw material is melted and refined by an electric arc furnace, followed subjected to decarburization by a steel converter. Then for the resultant decarburized molten steel, the stainless component and the temperature are appropriately adjusted by means a vacuum degassing chamber, followed by forming slabs by means of a continuous casting machine.

In the hot rolling process, the slabs are ground by means of a surface grinding machine, then re-heated by means of a furnace into a so-called hot coil state, followed by subjecting to the treatment by a roughing-ill mill then the treatment by a hot strip mill whereby the slab of more than 100 mm in thickness is hot-rolled into a slab having a thickness of 2 to 3 mm.

In the cold rolling process, in the case of a ferritic or martesitic stainless steel, after provisional annealing treatment is conducted by steel, after provisional annealing treatment is conducted by means of a bell type annealing furnace, in the case of an austenitenic stainless steel, without conducting provisional annealing treatment, annealing treatment and acid-washing are conducted using a continuous annealing and pickling line to remove an oxide (which is called "a scale") present on the stainless steel surface into a state capable of being readily cold-rolled. The cold rolling treatment for the resultant cold-rolled stainless steel is conducted by means of the sendzimir twenty rolls rolling mill or a tandem sendzimir rolling mill whereby it is processed and hardened into a plate of less than 1 mm in thickness. After the cold rolling treatment, when the 2D or 2B finishing is conducted, by means of a continuous annealing and picking line for cold-rolled strip, heat treatment and acid-washing are conducted for the recrystallization, softening, and carbon solution for the stainless steel. In the case of conducting the BA finishing, heat treatment is conducted in an inert gas using a continuous bright annealing line. In this case, no acid-washing is necessary to be conducted because no scale deposition occurred, where a strong brilliance can be attained.

In the final process, finish rolling using a finish rolling mill with a work roll or finish polishing using a finish polishing mill with a contact roll is conducted to obtain a stainless steel plate having a desired thickness and having a surface with the foregoing uneven surface pattern comprising a plurality of linear projections according to the present invention which is quite suitable for use in producing a photo-electricity generating device according to the present invention. For the thickness of the stainless steel plate, it is preferably in the range of from 0.1 mm to 0.5 mm.

As the finish rolling mill in the above, there can be used a four rolls cold rolling mill, a twelve rolls cold rolling mill, or a skinpass rolling mill.

As the work roll of the finish rolling mill or as the contact roll of the finish polishing mill, it is possible to use a work roll or contact roll respectively having surface flatness of the following value enables to effectively form the uneven surface pattern comprising a plurality of linear projections according to the present invention as desired. That is, for the surface flatness of the work roll or contact roll, when a center-line average surface roughness to—Ra(L) obtained when scanning is conducted in a circumference direction of the roll (shaped in a cylindrical form) and a center line average surface roughness Ra(H) obtained when scanning is conducted in a generatrix direction of the roll Ra(L) may be preferably be in the range of from 10 nm to 300 nm, and the Ra(H) may be preferably in the range of from 10 nm to 1000 nm or more preferably in the range of from 20 nm to 600 nm.

In the case where a desired uneven surface pattern comprising a plurality of linear projections according to the present invention could not be formed by one finish rolling or finish polishing treatment, the resultant irregular surface pattern can be adjusted into a desired state by additionally conducted appropriate polishing treatment or etching treatment. For instance, in the case of a stainless steel obtained by conducting the BA finishing and having an uneven surface pattern which is insufficient in the foregoing Ra(X) and Ra(Y) values, by softly etching the surface of the stainless steel plate by the etching manner which will be layer described there can be attained the formation of a desired uneven surface pattern which is sufficient in the foregoing Ra(X) and Ra(Y) values. In the case of a stainless steel obtained by conducting the 2D or 2B finishing and having an uneven surface pattern which has an excessive Ra(X) value and an excessive Ra(Y) value, by repeating the finish rolling treatment or the finish polishing treatment several times, there can be attained the formation of a desired uneven surface pattern which is sufficient in the foregoing Ra(X) and Ra(Y) values.

In the final process, there can be additionally conducted finish heat treatment, or treatment for correcting the warp of the stainless steel plate such as roller reveling or tension reveling.

The irregular surface patterns shown in FIGS. 1A, 1B and 1C according to the present invention can be formed by an appropriate polishing manner without conducting rolling treatment. The polishing manner may be employed in the case of a non-metallic substrate.

The polishing manner therein may be conducted by means of belt polishing, buff polishing, brush polishing or lap-polishing.

Besides, it may be conducted by means of surface treatment using a roller. In this case, by using a roller having an uneven surface with the foregoing Ra(L) and Ra(H) values, there can be attained the formation of a desired irregular surface pattern which is sufficient in the foregoing Ra(X) and Ra(Y) values in the present invention.

The polishing manner may be a polishing manner using abrasive grains. It is desired for the abrasive grains used to have a mean particle size preferably in the range of from 0.1 $\mu$m to 100 $\mu$m, more preferably in the range of from 0.2 $\mu$m to 50 $\mu$m.

It is possible to use two or more of the above polishing manners in combination.

The formation of any of the irregular surface patterns shown in FIGS. 1A, 1B and 1C according to the present invention may be conducted by the manner by way of molding wherein a mold having a surface provided with a pattern corresponding to any of the uneven surface patterns show in FIGS. 1A, 1B and 1C is press-contacted to the surface of the substrate. The mold having such surface pattern on the surface thereof may be prepared by an appropriate manner such as polishing, etching or patterning.

In the present invention, before, after or between the steps of rolling or polishing, it is possible to include a step of etching or annealing treatment for the surface of the substrate. The etching treatment in this case can be performed in vapor phase or liquid phase.

The vapor phase etching treatment may include gas etching treatment, plasma etching treatment and ion etching treatment. The gas etching treatment may be conducted using an appropriate etching gas of $CF_4$, $C_2F_6$, $C_3F_8$, $C_4F_{10}$, $CHF_3$, $CH_2F_2$, $Cl_2$, $ClF_3$, $CCl_4$, $CCl_2F_2$, $CClF_3$, $CHClF_2$, $C_2Cl_2F_4$, $BCl_3$, $PCl_3$, $CBrF_3$, $SF_6$, $SiF_4$, $SiCl_4$, $HF$, $O_2$, $N_2$, $H_2$, $He$, $Ne$, $Ar$ or $Xe$. Mixtures of two or more these gases may be also usable as the etching gas.

The plasma etching treatment may be conducted using a plasma generated from one or more gases selected from those above mentioned at a gas pressure of $1 \times 10^{-3}$ or 1 Torr by applying a D.C. or A.C. power, a RF (radio frequency) power with an oscillation frequency of 1 to 100 mHz, or other high frequency power such as microwave power with an oscillation frequency of 0.1 to 10 GHz. For a preferable range of the energy to produce the plasma, it is in the range of from 100 to 2000 V in the case of using the D.C. power. In the case of using the A.C. or RF power, it is in the range of 0.001 to 5 $W/cm^3$. In the case of using the microwave power, it is in the range of from 0.01 to 1 $W/cm^3$. For the substrate temperature upon conducting the etching treatment, it is preferably in the range of from 10 to 400° C., more preferably in the range of from 20 to 300° C. For the period of time during which the etching treatment is conducted, it is preferable in the range of from 0.5 to 100 minutes, more preferably in the range of from 2 to 60 minutes.

The liquid phase etching treatment may be conducted using an appropriate etching liquid (etchant). The etching liquid in this case may include acid series etching liquids and alkali series etching liquids.

Specific examples of the acid series etching liquid are etching liquids comprising sulfuric acid, hydrochloric acid, nitric acid, phosphoric acid, hydrofluoric acid, chromic acid, formic acid, lactic acid, glycollic acid, acetic acid, gluconic acid, succinic acid, malic acid, water dilutions of these compounds, or mixtures of these. Specific examples of the alkali series etching liquid are etching liquids comprising caustic soda, ammonium hydroxide, potassium hydroxide, sodium carbonate, sodium bicarbonate, sodium sesquicarbonate, monosodium phosphate, disodium phosphate, trisodium phosphate, sodium pyrophosphate, sodium tripolyphosphate, sodium tetrapolyphosphate, sodium hexametaphosphate, sodium orthosilicate, sodium metasilicate, water dilutions of these compounds, or mixtures of these.

In the case of the liquid phase etching treatment, it is possible to heat the etching liquid or to apply an energy of an ultrasonic (supersonic) wave to the etching liquid.

In the case where the acid series or alkali series etching liquid is diluted by water, the acid or alkali concentration is desired to be preferably in the range of from 1 to 80 volume %, more preferably in the range of from 5 to 50 volume %. For the temperature of the acid series or alkali series etching liquid upon conducting the etching, it is preferably in the range of from 10 to 80° C., more preferably in the range of from 20 to 60° C. For the period of time during which the etching treatment is conducted, it is preferably in the range of from 5 seconds to 30 minutes, more preferably in the range of from 10 seconds to 10 minutes.

In the case where the annealing treatment is employed, the annealing treatment may be conducted in a gaseous atmosphere composed of air, steam, nitrogen gas, hydrogen gas, oxygen gas, inert gas, or other appropriate gases at an appropriate annealing temperature and for an appropriate annealing treatment period of time selected depending upon the kind of the constituent of the substrate. For the annealing temperature, in general, it is desired to be preferably in the range of from 200 to 800° C., more preferably in the range of from 400 to 700° C. For the annealing period of time, in general, it is desired to be preferably in the range of from 1 to 100 minutes, more preferably in the range of from 2 to 60 minutes.

In the case of forming the uneven surface pattern as shown in FIG. 1D wherein a plurality of second (minute) linear projections of straight-line shape each having a length of at most 20 μm and arranged perpendicular to a plurality first linear projections of straight-line shape, the above-described manners for forming the uneven surface pattern (including the first linear projections) may also be adopted in the present invention. In this instance, the uneven surface pattern including the second linear projections may have a height or depth (distance between adjacent projection and recess portions) which is larger than that of the uneven surface pattern including the first linear projections.

Hereinbelow, the process for forming a zinc oxide film according to the present invention will be described.

The zinc oxide film is formed on the surface of the above-described substrate (generally on the electroconductive substrate) by a liquid-phase deposition such as electrodeposition (electrolytic deposition) or electroless deposition (non-electrolytic deposition).

When the electrodeposition is employed, the zinc oxide may generally be formed on the electroconductive substrate in the following manner.

In an electrolytic tank containing an aqueous solution (electrolytic solution, e.g., aqueous zinc nitrate solution) containing at least nitrate ions and zinc ions, the electroconductive substrate as a cathode and a counter electrode substrate (plate) of e.g., Zn as an anode are immersed in the aqueous solution, followed by application of a constant current or voltage between the cathode and anode through which an appropriate current passes. As a result, the zinc oxide film is precipitated or deposited on the electroconductive substrate by the electrodeposition reaction. The anode may be made of Zn (purity=at least 99.99%), or an insoluble material such as platinum or carbon.

The aqueous solution may preferably contain zinc nitrate providing both nitrate ions and zinc ions in an amount of 0.001–1 mol/l, more preferably 0.0025–0.5 mol/l as a zinc nitrate concentration. The aqueous solution may also contain a mixture of a water-soluble nitrate such as ammonium nitrate providing the nitrate ions and a salt of zinc such as zinc sulfate providing zinc ions.

The aqueous solution may preferably be kept at a temperature of at least 50° C., more preferably 60–90° C.

When the electrodeposition is controlled by the constant current supply, a current applied between the cathode and the anode may preferably have a current density of 0.1–100 $mA/cm^2$, more preferably 1–20 $mA/cm^2$. In the case of using the constant-voltage supply, a voltage applied may preferably be 0.2–40 V, more preferably 0.5–10 V.

When the preferred ranges of the conditions for the electrodeposition described above (the zinc nitrate concentration, aqueous solution temperature, current density, and applied voltage) are failed to be employed, a degree of anomalous growth of the zinc oxide film is increased or the metallic zinc or zinc hydroxide is precipitated in some cases.

The aqueous solution as the electrolytic solution may preferably be stirred and/or circulated by using a circulating pump.

The aqueous solution may further contain a carbohydrate in order to suppress or minimize the occurrence of anomalous growth of the zinc oxide film. Examples of the carbohydrate may include glucose, fructose, galactose, saccharose, maltose, dextrin and starch. These carbohydrates may appropriately be added to the aqueous solution in view of the kind, particularly a molecular weight or a solubility in water, of the carbonhydrate used. When saccharose is used, saccharose may preferably be contained in the aqueous solution in an amount of 1–300 g/l, more preferably 4–100 g/l. In the case of dextrin having a molecular weight much larger than that of saccharose, dextrin may preferably be added in the aqueous solution in an amount of 0.001–10 g/l, more preferably 0.01–5 g/l.

By the addition of the above-mentioned carbohydrate in the aqueous solution, a uniformity of film properties (e.g., film thickness, electroconductivity, crystal particle size and crystal orientation) over the entire film-forming surface of the electroconductive substrate is further improved. Specifically, the occurrence of anomalous growth of zinc oxide crystals is suppressed to improve a production yield of the resultant photo-electricity generating device. The use of the carbohydrate allows easy control of the resultant film properties such as the electroconductivity, crystal particle size and crystal orientation, thus enlarging the range of the electrodeposition conditions providing a desired characteristic to improve a controllability of the zinc oxide film formation. Further, when the electrodeposition of the zinc oxide film is effected, an amount of a powdery substrate precipitated or deposited on the bottom portion of the electrolytic tank is decreased, thus enhancing maintenance properties of the film-forming (electrodeposition) apparatus in liquid phase.

The crystal particle size and crystal orientation characteristic of the deposited zinc oxide film largely vary depending on the zinc nitrate concentration, the aqueous solution temperature, the deposition rate and the addition amount of the carbohydrate. In the present invention, by controlling these conditions in appropriate ranges, respectively, the crystal particle size is controlled within a desired range and a desired crystal orientation characteristic of the zinc oxide film (e.g., a zinc oxide film having wurtzite structure showing c-axis orientation or a zinc oxide film having a crystal structure showing inclined or tilted c-axis orientation) is obtained.

Further, depending on the values of these parameters (crystal particle size and crystal orientation), it is possible to form various zinc oxide films having a minute uneven surface structure showing a light-scattering characteristic. The minute uneven surface structure is minuter than that of the electroconductive substrate and a degree of the light-scattering characteristic of the zinc oxide film is such that the minute uneven surface structure causes scattering of light but the scattered light does not cause defects in the resultant photo-electricity generating device.

The crystal particle size of the deposited zinc oxide film is liable to become larger with a larger zinc nitrate concentration or a slower deposition rate of the zinc oxide film. Further, the c-axis orientation of the deposited zinc oxide crystal is liable to be inclined or tilted in the case of setting a larger zinc oxide concentration, a slower zinc oxide deposition rate and a smaller carbohydrate addition amount. The thus inclined (tilted) c-axis orientation is liable to provide the above-mentioned minute uneven surface structure to the zinc oxide film.

When the electroless deposition is performed for forming the zinc oxide film or the electroconductive substrate surface, the aqueous solution (e.g., the aqueous zinc nitrate solution) containing nitrate ions and zinc ions requires the addition of a reducing agent, such as dimethylamine borane (DMAB), hydrazine, formaldehyde, phosphonates, phosphinates, or sodium boron hydride. When dimethylamine borane (DMAB) is used as the reducing agent, DMAB may preferably be contained in the aqueous solution in an amount of 0.001–0.25 mol/l, more preferably 0.025–0.1 mol/l. In addition, a complexing agent may further be added as desired. Examples of the complexing agent may include ethanolamine, diethanolamine, triethanolamine, diethylenetriaminepentaacetic acid, diethylene-diaminetetraacetic acid, and nitrilotriacetic acid.

By using the electroless deposition, it becomes possible to readily effect the liquid-phase deposition of the zinc oxide film to the surface of an electroconductive substrate of, e.g., aluminum on which the zinc oxide film is not readily formed (electrically deposited) or the surface of an electrically insulating substrate.

In the case where the electroless deposition is performed on a substrate having a flat (or even) surface, a pretreatment with a catalyst according to, e.g., a sensitizing-activating scheme is generally required in many cases. In the present invention, however, the uneven surface described above is provided to the electroconductive substrate, thus omitting the pretreatment or reducing the pretreatment time.

In the present invention, on the substrate (on which the above-described metal layer may be formed as a backside reflection layer), a zinc oxide film consisting of a plurality of layers may be formed by forming a first zinc oxide film on the substrate through the electroless deposition and then forming a second zinc oxide film on the first zinc oxide film through the electrodeposition.

The zinc oxide film to be formed on the substrate may also be formed on a transparent electrode described hereinafter.

The zinc oxide film is required to have a sufficient transmittance for light having a wavelength which can be absorbed by the semiconductor layer and to have an adequate volume resistivity (electric resistance). For the transmittance, it is preferably 80% or more, more preferably 85% or more, most preferably 90% or more, for light having a wavelength of 650 nm or more. For the electric resistance, it is. preferably in the range of $1\times10^{-4}$–$1\times10^{6}$ ohm.cm, more preferably in the range of $1\times10^{-2}$–$5\times10^{4}$ ohm.cm.

The zinc oxide film formed by the processes according to the present invention may preferably have a thickness of 0.1–10 μm, more preferably 0.5–3 μm.

Figure 2:
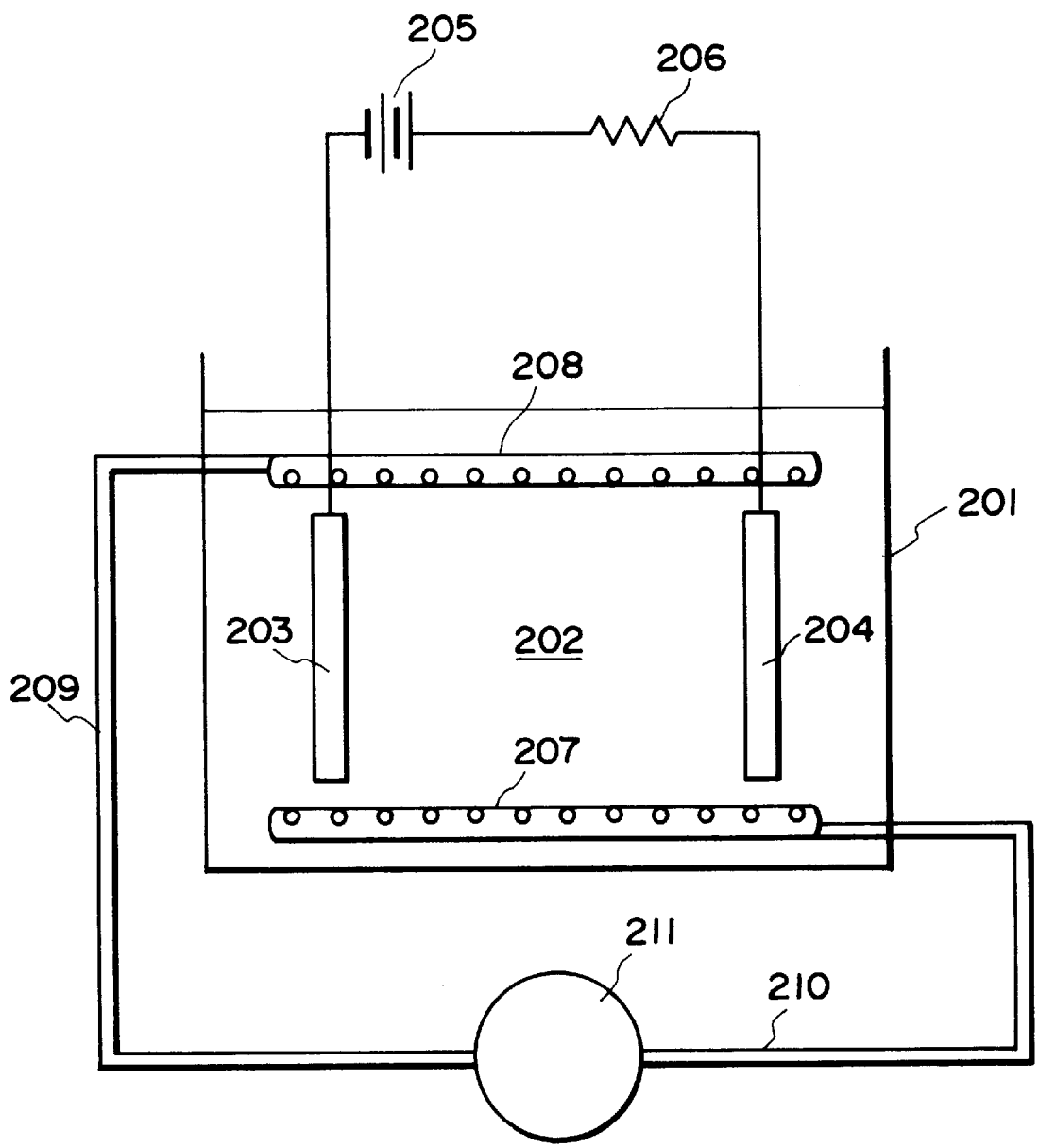
FIG. 2 is a schematic sectional view showing an embodiment of an apparatus for forming an zinc oxide film on an electroconductive substrate by a liquid-phase deposition used in the present invention.

The zinc oxide film may be formed by using an apparatus as shown in FIG. 2.

Referring to FIG. 2, the apparatus includes an anticorrosive tank (electrolytic tank) 201, an aqueous solution 202 containing, e.g., nitrate ions, zinc ions and a carbohydrate, an electroconductive substrate 203 as a cathode, a counter electrode 204 of, e.g., a zinc plate (e.g., 1 mm in thickness and purity =99.99%) as an anode.

The electroconductive substrate 203 (cathode) and the counter electrode 204 (anode) are connected with a power supply 205 via a load resistance 206 so as to pass a substantially constant current between the cathode and the anode.

Further, in order to improve an efficiency of the zinc oxide film formation by stirring or circulating the aqueous solution 202 to decrease a degree of a film-formation irregularity and to increase a film-forming rate, a solution circulating system is provided to the apparatus. The circulating system includes an inlet or suction bar 208 provided with plural solution entrance (suction) ports, an outlet or discharge bar 207 provided with plural discharge ports, a circulating pump 211, an inlet pipe 209 connected with the inlet bar 208 and the pump 211, and an outlet pipe 210 connected with the outlet bar 207 and the pump 211.

In the case of using a small-sized apparatus, a magnetic stirrer may be used instead of the circulating system.

In the apparatus of FIG. 2, a temperature control means (not shown) comprising a heater and a thermocouple may preferably be used for effecting a temperature control of the aqueous solution while monitoring the solution temperature.

Figure 4:
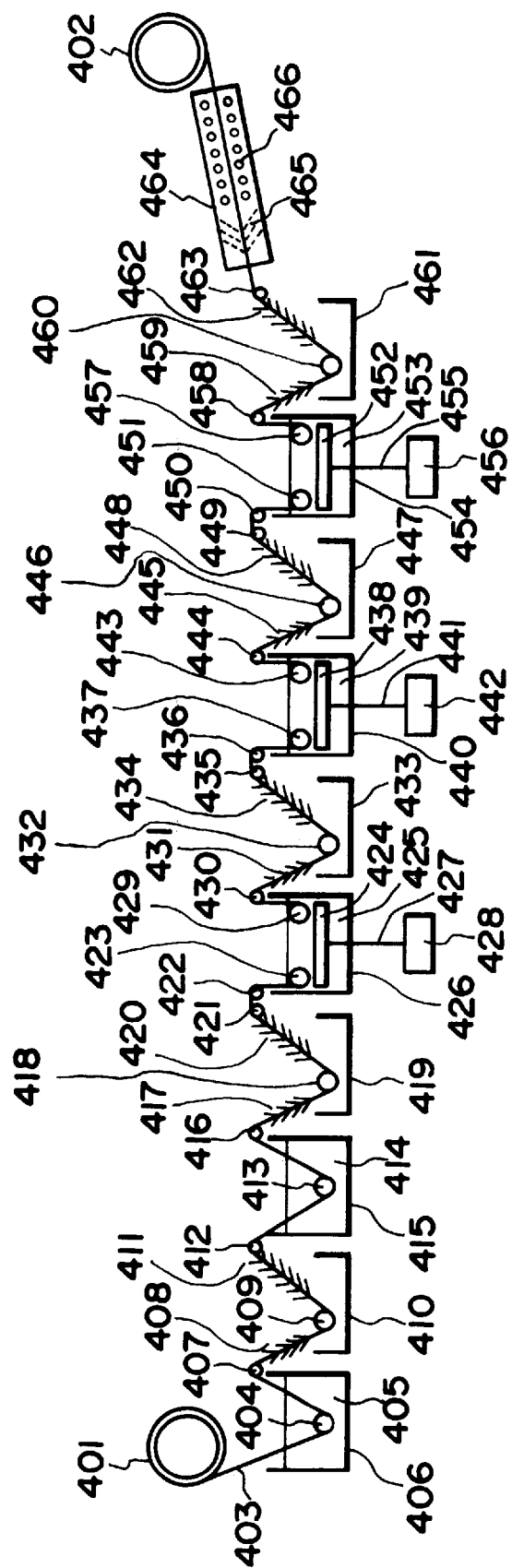
FIG. 4 is a schematic sectional view showing an embodiment of a continuous film-forming apparatus used in the present invention, wherein a metal layer and first and second zinc oxide films are successively formed on an elongated electroconductive sheet substrate.

In the present invention, it is possible to employ a continuous film-forming apparatus (as shown in FIG. 4 described hereinafter) wherein an elongated electroconductive sheet substrate provided with the above-described uneven surface (as shown in FIGS. 1A–1D) is successively immersed or dipped in an aqueous solution containing at least nitrate ions and zinc ions while conveying the sheet substrate in its lengthwise (elongated) direction.

The substrate for the semiconductor device described above (provided with the liquid phase-deposited zinc oxide film) is applicable to the photo-electricity generating device.

Figure 3:
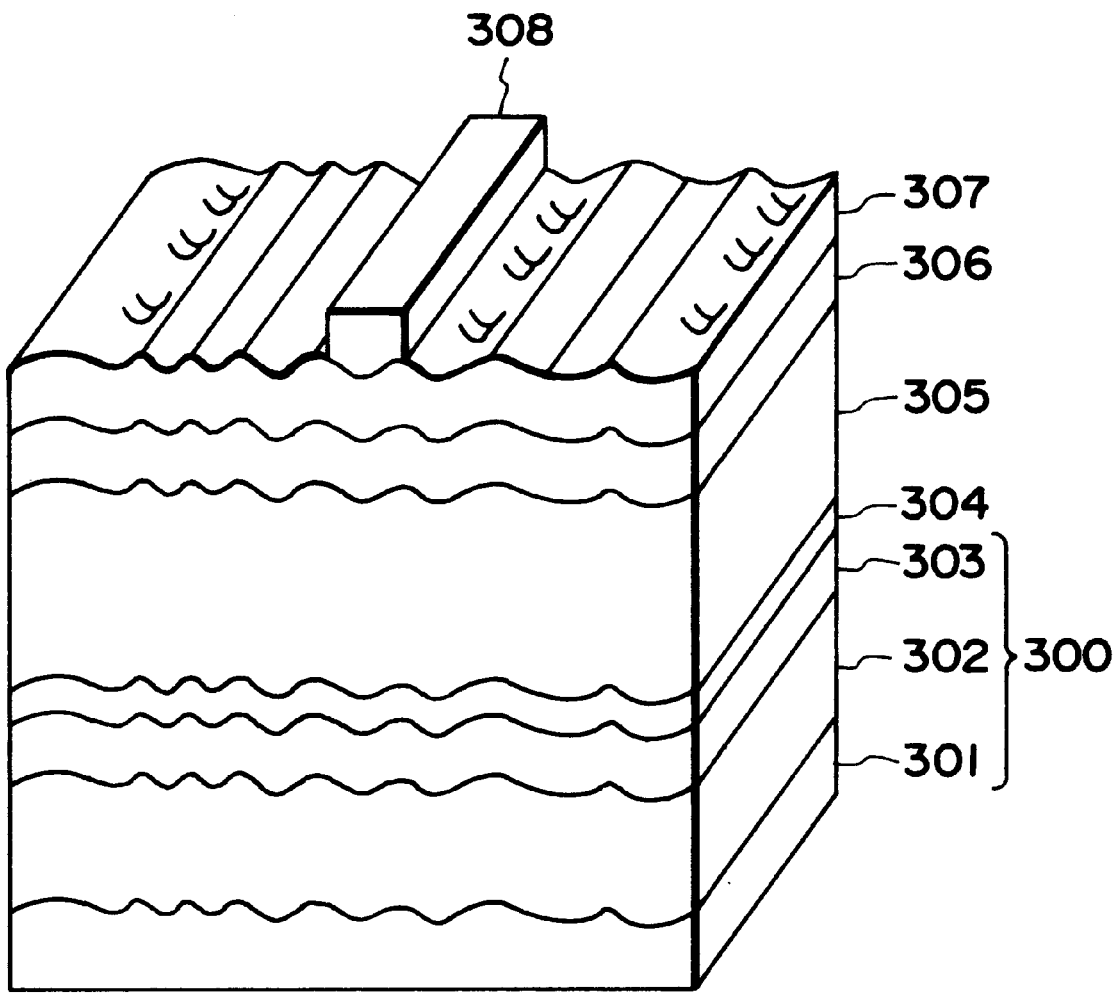
FIG. 3 is a schematic perspective view showing an embodiment of a photo-electricity generating device having a single cell structure produced through the process according to the present invention.

FIG. 3 shows an embodiment of a layer structure of the photo-electricity generating device using the substrate for the semiconductor device.

Referring to FIG. 3, the photo-electricity generating device includes an electroconductive substrate 301 provided with an appropriate uneven surface as described above, a metal (backside reflection) layer 302, a zinc oxide film 303, an n-type semiconductor layer (n-type layer) 304, an i-type semiconductor layer (i-type layer) 305, a p-type semiconductor layer (p-type layer) 306, a transparent electrode 307 and a collector (grid) electrode 308. The electroconductive substrate 301, the metal layer 302 and the zinc oxide 303 together constitute a substrate for an semiconductor device (element) 300. Further, the n-type layer 304, the i-type layer 305 and the p-type layer 305 together constitute a pin junction-type semiconductor layer.

Examples of a principal material for the semiconductor layer used in the present invention, amorphous (a-) or microcrystalline ($\mu$c-) Si, C, Ge or alloys thereof may suitable be used. The semiconductor layer may also preferably contain hydrogen and/or halogen in an amount of 0.1–40 atomic %, and may further include oxygen atom and/or nitrogen atom at a concentration of at most $5 \times 10^{19}$ cm$^{-3}$.

Further, in order to provide the p-type semiconductor layer and the n-type semiconductor layer, Group III elements and Group V elements may be added in the semiconductor layers, respectively. Between the i-type layer and the p-type layer and/or between the i-type layer and the n-type layer, it is possible to form an i-type buffer layer.

When the photo-electricity generating device has a stacked cell structure comprising plural semiconductor layers each including pin junction, an i-type constituting layer of the pin junction-type semiconductor layer closer to the side through which incident light passes may preferably have a broader band gap and a constituent layer may preferably have a narrower band gap with an increasing distance from the incident side of light. Further, within the respective i-type layer, a portion closer to the adjacent p-type layer may preferably have a minimum of the band gap compared with a central portion.

The doping layer (n-type layer or p-type layer) on the incident side of light may preferably be made of a crystalline semiconductor material showing less light absorption or a semiconductor material having a broader band gap.

The semiconductor layer may preferably have an uneven surface having a pattern corresponding to the above-described uneven surface pattern including the linear projections, whereby on the incident light side, particularly at a boundary between the semiconductor layer and the (upper) transparent electrode, a degree of light scattering is enhanced, thus scattering the light both on the incident light side and on the backside of the semiconductor layer. As a result, an optical path or distance is further elongated or lengthened to increase a degree of light absorption, thus further enhancing a resultant short circuit current (Isc).

The semiconductor layer may suitably be formed through processes including microwave plasma chemical vapor deposition (MW plasma CVD), or radio frequency plasma chemical vapor deposition (RF plasma CVD).

Generally, the semiconductor layer used in the present invention may be formed in the following manner.

(1) A deposition chamber capable of being placed in a reduced-pressure state (vacuum chamber) is reduced in pressure within the chamber so as to provide a prescribed initial pressure (inner pressure).

(2) Into the deposition chamber, gases (principal gases and dopant (dilution) gases) are introduced to control the inner pressure so as to provide a prescribed deposition pressure within the chamber while actuating the vacuum pump for evacuation.

(3) An electroconductive substrate provided with a zinc oxide film is heated by a heater up to a prescribed temperature.

(4) For the MW plasma CVD, a microwave power supply (source) is switched on to introduce a microwave into the chamber through a waveguide and a dielectric window (of, e.g., alumina-based ceramics). When a low (oscillation) frequency of 100 MHz–1 GHz is used, the microwave is applied through a metal electrode.

For the RF plasma CVD, a high (radio) frequency is introduced from a high-frequency power supply into the chamber via a discharge electrode.

(5) A plasma of the introduced gases is produced and electrically dissociated, thus being deposited on the zinc oxide film of the semiconductor device substrate.

In the case of the MW plasma CVD, conditions therefore in the deposition chamber may preferably include a substrate temperature of 100–450° C., an inner pressure of 0.5–30 mTorr, a microwave power of 0.01–1 W/cm$^3$, a microwave frequency of 0.1–10 GHz an a deposition rate of 0.05–20 nm/sec.

In the case of the RF plasma CVD, conditions therefor in the deposition chamber may preferably include a substrate temperature of 100–350° C., an inner pressure of 0.1–10 Torr, a radio frequency power of 0.001–0.5 W/cm$^3$, a radio frequency of 0.1–100 MHz and a deposition rate of 0.01–3 nm/sec.

Gases (principal gases) suitable for deposition of amorphous semiconductor layer of Group IV elements and alloys of Group IV elements may principally comprise: silicon-containing compounds capable of being gasified, such as $SiH_4$ and $Si_2H_6$; and germanium-containing compound capable of being gasified, such as $GeH_4$. Further, these gases may optionally comprise compounds which contain carbon, nitrogen and/or oxygen and which can be gasified.

As a dopant gas for forming a p-type layer, $B_2H_6$ and $BF_3$ may generally be used. Further, $PH_3$ and $PF_3$ may generally be used as a dopant gas for forming an n-type layer.

Particularly, when a microcrystalline semiconductor layer, a polycrystalline semiconductor layer or an semiconductor layer, such as an SiC layer, having a low light-absorption property or a broader band gap is deposited on the zinc oxide layer, the semiconductor layer is formed by using an MW power or RF power providing a relatively high power value while increasing a dilution degree of the principal gas with hydrogen gas.

The transparent electrode (electroconductive layer) may be formed in an appropriate thickness, thus also functioning as a reflection-preventing layer.

The transparent electrode may generally be formed by using a material, such as ITO (indium tin oxide), ZnO or $InO_3$, through vapor deposition, CVD, spray coating, spinner coating or dip coating.

The transparent electrode may further contain a substance for changing (controlling) an electroconductivity.

The transparent electrode may have a flat surface or an uneven surface, preferably an uneven surface having a pattern corresponding to the above-described uneven surface pattern including the linear projections. As a result, a degree of light scattering on the incident light side, particularly at a boundary between the underlying semiconductor layer and the transparent electrode is enhanced, thus effectively effecting the scattering of the light both on the incident light side and the backside of the semiconductor layer. As a consequent, an optical path (distance) is further lengthened to increase a degree of light absorption, thus further enhancing a resulting short circuit current (Isc).

The collector (grid) electrode is formed for improving a charge (or current)-collection efficiency. The collector electrode may generally be formed by processes including one wherein a metal electrode pattern is formed by sputtering with a mask; a printing process with an electroconductive paste or solder paste; and one wherein a metal wire is fixed by using an electroconductive paste.

The photo-electricity generating device produced by the process according to the present invention may be covered with protective layers at both sides thereof. In this case, reinforcing members, such as steel sheet or plate, may be used in combination with the protective layers.

Hereinbelow, the present invention will be described more specifically based on Examples.

EXAMPLE 1

A ferrite stainless steel slab (SUS 430) after effecting cold rolling was subjected to bright annealing and a surface treatment with a skinpass rolling mill (so-called BA finish), followed by cutting to obtain five 0.15 mm-thick stainless steel plates each of 50×50 mm in size.

Each stainless steel plate (50×50×0.15 mm) was subjected to etching with an etchant (hydrofluoric acid-nitric acid mixture; $HF:HNO_3:H_2O=1:3:15$ in molar ratio) for 15 sec. at room temperature.

When the thus-etched stainless steel plate was subjected to measurement of center-line average surface roughnesses Ra(X) and Ra(Y) by using a profilometer (surface roughness meter) ("ALPHA STEP 200", available from TENCOR Co.), the stainless steel plate had an uneven surface including linear projections and providing an Ra(X) of 15 nm (in X-direction parallel to the linear projections) and an Ra(Y) of 20 nm (in Y-direction perpendicular to the linear projections).

The above etching treatment was also found to be effective in removing a passivation film and surface activation at the surface of the stainless steel plate.

On the stainless steel plate after washing with pure water and drying, a 1 μm-thick bright-plated Ag film (metal layer as backside reflection layer) by hard silver plating in a plating bath comprising silver cyanide (30 g/l), potassium antimonytartrate (3 g/l), free cyan (120 g/l), potassium tartrate (70 g/l) and potassium hydroxide (80 g/l) under conditions including an anode of the stainless steel plate, a plating temperature of 25° C. and a cathode current density of 5 mA/cm².

On the Ag-plated stainless steel plate, a 1 μm-thick zinc oxide film was formed by using an electrodeposition apparatus shown in FIG. 2 in the following manner.

The stainless steel plate as a cathode and a 1 mm-thick zinc (Zn) plate (purity=99.99%) as an anode (counter electrode) were immersed in an aqueous zinc nitrate solution (zinc nitrate concentration=0.05 mol/l), followed by passing a constant current between the stainless steel plate and the Zn counter electrode for 10 minutes at 85° C. and at a current density of 2.5 mA/cm².

The thus formed zinc oxide film showed a crystal orientation wherein a c-axis was perpendicular to the surface of the stainless steel plate, thus having a substantially even (flat) surface.

On the thus prepared substrate for a semiconductor device, an semiconductor layer comprising an n-type layer of an a-Si material, an i-type layer of an a-Si material and a p-type layer of a μc-Si material (stacked in this order from the substrate side) was formed by using a multi-chambered deposition apparatus.

The n-type and p-type layers (of a-Si materials) were formed by RF plasma CVD.

The i-type layer (of μc-Si material) had a three-layered structure comprising a first RF i-type layer (first buffer layer) formed by the RF plasma CVD, an MW i-type layer formed by MW plasma CVD, and a second RF i-type layer (second buffer layer) formed by the RF plasma CVD.

After the deposition of the second RF i-type layer, the surface thereof was exposed to hydrogen plasma before the formation of the p-type layer.

Conditions for forming and treating the semiconductor layer comprising the n-type, i-type and p-type layers were shown in Table 1 appearing hereinbelow.

On the thus-formed semiconductor layer (having the p-type layer as a surface layer), a 70 nm-thick ITO (indium-tin-oxide) film (transparent electrode) was vacuum-deposited by resistance heating.

Then, a comb-shaped mask was superposed on the ITO film, followed by electron-beam vacuum vapor deposition to form a comb-shaped collector electrode comprising Cr (100 nm)/Ag (1 μm)/Cr (100 nm) so that parallel strip portions (as grid electrodes) were arranged perpendicular to the linear projections of the stainless steel plate surface, thus preparing a photo-electricity generating device as shown in FIG. 3.

Conditions for forming and treating the above-mentioned structural members were summarized in Table 1 below.

TABLE 1

| | |
|---|---|
| SUS treatment: | Rolling treatment/bright annealing (BA) |
| skinpass rolling: | done |
| surface polishing: | none |

TABLE 1-continued

| | |
|---|---|
| surface treatment: | hydrofluoric acid-nitric acid mixture (HF:HNO$_3$:H$_2$O = 1:3:15) 15 sec. |
| metal layer: | Al: 1 μm |
| ZnO layer: | 1 μm, zinc nitrate concentration: 0.05 mol/l, solution temperature: 85° C., current density: 2.5 mA/cm$^2$ |
| n-type layer: | SiH$_4$: 1 sccm, H$_2$: 45 sccm, PH$_3$ (diluted to 1% by H$_2$): 0.5 sccm, inner pressure: 1.2 Torr, RF power: 2 W, substrate temperature: 330° C., layer thickness: 20 nm |
| RFi-type layer: | Si$_2$H$_6$: 4 sccm, H$_2$: 90 sccm, inner pressure: 0.5 Torr, RF power: 1.7 W, substrate temperature: 300° C., layer thickness: 10 nm |
| MWi-type layer: | SiH$_4$: 40 sccm, GeH$_4$: 40 sccm, H$_2$: 150 sccm, inner pressure: 8 Torr, MW power: 200 W, RF bias power: 700 W, substrate temperature: 380° C., layer thickness: 70 nm |
| RFi-type layer: | Si$_2$H$_6$: 4 sccm, H$_2$: 90 sccm, inner pressure: 0.5 Torr, RF power: 1.7 W, substrate temperature: 300° C., layer thickness: 20 nm |
| Hydrogen plasma treatment: | H$_2$: 80 sccm, inner pressure: 2.0 Torr, RF power: 30 W, substrate temperature: 200° C., |
| p-type layer: | SiH$_4$ (diluted to 10% by H$_2$): 0.25 sccm, H$_2$: 35 sccm, BF$_3$ (diluted to 2% by H$_2$): 2 sccm, inner pressure: 2 Torr, RF power: 30 W, substrate temperature: 200° C., |
| transparent electrode: | ITO, reactive deposition, layer thickness: 70 nm |
| collector electrode: | Cr (100 nm)/Ag (1 μm)/Cr (100 nm) |

EXAMPLE 2

A photo-electricity generating device was prepared in the same manner as in Example 1 except that the BA finish of the cold-rolled stainless steel slab (SUS 430) was changed to a so-called 2D finish wherein the stainless steel slab was subjected to heat treatment and acid washing, followed by light rolling with a roll having a small surface roughness and that the etching treatment with the hydrofluoric acid-nitric acid mixture was not effected.

The 2D-finished stainless steel plate (before the overlying layers were formed) was subjected to measurement of center-line average surface roughnesses Ra(X) and Ra(Y) in the same manner as in Example 1, whereby the stainless steel plate was found to have an uneven surface including linear projections and having an Ra(X) of 65 nm and Ra(Y) of 200 nm.

EXAMPLE 3

A photo-electricity generating device was prepared in the same manner as in Example 1 except that the BA finish of the cold-rolled stainless steel slab (SUS 430) was changed to a so-called 2D finish similarly as in Example 2 and that the etching treatment was performed for 1 minute with a hydrofluoric acid-nitric acid mixture (HF:HNO$_3$:H$_2$O=1:3:5).

The stainless steel plate (before the overlying layers were formed) was subjected to measurement of center-line average surface roughnesses Ra(X) and Ra(Y) in the same manner as in Example 1, whereby the stainless steel plate was found to have an uneven surface including linear projections and having an Ra(X) of 300 nm and Ra(Y) of 600 nm.

EXAMPLE 4

A photo-electricity generating device was prepared in the same manner as in Example 1 except that (1) the BA finish of the cold-rolled stainless steel slab (SUS 430) was changed to a so-called 2B finish wherein a cold-rolled austenitenic stainless steel slab (SUS 304) was subjected to heat treatment and acid washing, followed by light cold rolling, that (2) the 1 μm-thick Ag layer was changed to a 0.5 μm-thick copper (Cu) layer, and that (3) the zinc oxide film forming conditions were changed as described below.

The 0.5 μm-thick Cu layer was formed by electroplating with a plating bath comprising copper pyrophosphate (80 g/l), potassium pyrophosphate (300 g/l), ammonia water (6 ml/l), potassium nitrate (10 g/l) under conditions including an anode of a Cu plate, a cathode of the stainless steel plate, a plating temperature of 50–60° C., a pH of 8.2–8.8 and an anode current density of 30 mA/cm$^2$.

The 1 μm-thick zinc oxide film was formed in the same manner as in Example 1 except that the following electrodeposition conditions were adopted.

Zinc nitrate concentration: 0.2 mol/l

Carbohydrate: saccharose (50 g/l) added

Current density: 4.5 mA/cm$^2$

Current application time: 5 min.

The 2B finished stainless steel plate (before forming the overlying layers) was subjected to measurement of center-line average surface roughnesses Ra(X) and Ra(Y) in the same manner as in Example 1, whereby the stainless steel plate was found to have an uneven surface including linear projections and having an Ra(X) of 70 nm and an Ra(Y) of 100 nm.

The zinc oxide film formed on the Cu-plated stainless steel plate showed a crystal orientation wherein a c-axis was inclined or tilted from a normal to the plate surface, thus having a surface unevenness (uneven surface) which was minuter than the uneven surface pattern of the stainless steel substrate. The surface unevenness of the zinc oxide film provided a uniform uneven surface pattern having an Ra of ca. 35 nm (obtained by subtracting those for the plate from the measured values) at an average pitch of 0.8 μm over the entire zinc oxide film surface.

The semiconductor layer formed on the zinc oxide film as also found to have an uneven surface (surface unevenness).

EXAMPLE 5

A photo-electricity generating device was prepared in the same manner as in Example 1 except that the surface treatment of the stainless steel slab (SUS 430) was changed as described below and the metal layer and zinc oxide film were formed as described below.

The surface treatment was performed by the above-mentioned 2D finish (as in Example 2) and dry, etching with Ar gas and a sputtering apparatus under the following conditions.

Ar gas flow: 25 sccm

Pressure: 6 mTorr

RF power (substrate side): 400 W

Ar plasma retention time: 10 min.

The resultant surface of the stainless steel plate was observed through an scanning electron microscope (SEM) to confirm minute second linear projections of 8 um in average length in a direction perpendicular to first linear projections providing a uneven surface to the stainless steel plate. When the uneven surface of the stainless steel plate was subjected to measurement of the surface roughness similarly as in Example 1, the uneven surface (of the stainless steel plate) had an Ra(X) of 110 nm and an Ra(Y) of 250 nm.

The metal layer was prepared by forming a 0.1 $\mu$m-thick Al layer on the stainless steel plate through DC magnetron sputtering with an aluminum target and by forming a 0.1 $\mu$m-thick ZnO layer on the Al layer through the DC magnetron sputtering with a ZnO target, respectively under the following conditions.

| Conditions | Al layer | ZnO layer |
|---|---|---|
| Substrate temp. | room temp. | 200° C. |
| Ar gas flow (sccm) | 25 | 10 |
| Pressure (mTorr) | 6 | 2.4 |
| DC power (volts) | ca. −500 | ca. −430 |
| Ar plasma retention time (sec) | 30 | 70 |
| Constant current (A) | 1.0 | 1.0 |

The formation of the zinc oxide film on the metal layer was performed in the same manner as in Example 1 except that the following electrodeposition conditions were adopted.

Zinc nitrate concentration: 0.25 mol/l

Carbohydrate: saccharose (80 g/l) added

Current density: 5.5 mA/cm$^2$

Current application time: 4 min.

Film thickness: 0.9 $\mu$m

The zinc oxide film formed on the stainless steel plate coated with the metal layer (Al layer and ZnO layer) showed a crystal orientation wherein a c-axis was inclined from a normal to the plate surface, thus having a surface unevenness (uneven surface) which was minuter than the uneven surface pattern of the stainless steel plate. The surface unevenness of the zinc oxide film provided a uniform uneven surface pattern having an Ra of ca. 40 nm (obtained by subtracting those for the plate from the measured values) at an average pitch of 1.0 $\mu$m.

Further, the resultant photo-electricity generating device had a uneven surface corresponding to the uneven surface pattern of the stainless steel plate. The uneven surface of photo-electricity generating device had an Ra(X) of 80 nm and an Ra(Y) of 200 nm.

EXAMPLE 6

A photo-electricity generating device was prepared in the same manner as in Example 3 except that the etching time (1 min.) was changed to 20 sec., and that the metal layer and the zinc oxide film were formed as described below.

When the 2D-finished stainless steel plate was subjected to measurement of the average surface roughnesses Ra(X) and Ra(Y) in the same manner as in Example 1, the stainless steel plate had an uneven surface including linear projections (first linear projections) and having an Ra(X) of 200 nm and an Ra(Y) of 350 nm. Further, as a result of the SEM observation similarly as in Example 5, the uneven surface also had minute linear projections (second linear projections) of 10 $\mu$m in average length in a direction perpendicular to the first linear projections.

The metal layer was prepared by forming a 0.1 $\mu$m-thick AlSi layer on the stainless steel plate through DC magnetron sputtering with an AlSi target (Al/Si=99/1).

The zinc oxide film was prepared by forming a 0.1 $\mu$m-thick first zinc oxide film on the AlSi layer through electroless deposition under conditions shown below and by forming a 0.9 $\mu$m-thick second zinc oxide film on the first zinc oxide film through electrodeposition under conditions shown below.

Electroless deposition conditions

Aqueous solution: average surface of zinc nitrate (0.1 mol/l)

Reducing agent: dimethylamine borane (DMAB, 0.1 mol/l)

Bath temperature: 70° C.

pH: 6.0

Deposition time: 10 min.

Electroless deposition conditions

Aqueous solution: average surface of zinc nitrate (0.25 mol/l)

Carbohydrate: Dextrin (1 g/l) added

Current density: 5.5 mA/cm$^2$

Current application time: 4 min.

The formation of the first zinc oxide film through the electroless deposition allowed the formation of the second zinc oxide film through the electrodeposition on the Al-based (AlSi) metal (backside reflection) layer.

The thus prepared zinc oxide film showed a crystal orientation wherein a c-axis was inclined from a normal to the plate surface, thus having a surface unevenness (uneven surface) which was minuter than the uneven surface pattern of the stainless steel plate. The surface unevenness of the zinc oxide film provided a uniform uneven surface pattern having an Ra of ca. 30 nm (obtained by subtracting those for the plate from the measured values) at an average pitch of 0.7 $\mu$m.

Further, the resultant photo-electricity generating device has an uneven surface corresponding to the uneven surface pattern of the stainless steel plate. The uneven surface of the photo-electricity generating device had an Ra(X) of 150 nm and an Ra(Y) of 250 nm.

EXAMPLE 7

An elongated stainless steel sheet substrate (SUS 430) (length=100 m, width=30 cm, thickness=0.13 mm) after rolling treatment by using a rolling mill was washed with an acid and then coiled or wound about a feed bobbin disposed within a vacuum chamber, in which the sheet substrate was subjected to annealing for 2 min. at 200° C. by feeding the sheet substrate while winding up the sheet substrate by another bobbin (wind-up bobbin).

On the thus treated sheet substrate, a 0.4 $\mu$m-thick metal (Cu) layer and a zinc oxide layer comprising a 0.15 $\mu$m-thick first zinc oxide layer and a 0.9 $\mu$m-thick second zinc oxide layer were formed by using a continuous liquid-phase film-forming apparatus as shown in FIG. 4.

Referring to FIG. 4, between a feed roller 401 for feeding sheet substrate 403 and a wind-up (take-up) roller 402 for winding up the sheet substrate 403; then tanks including a degreasing tank 406, a water washing (cleaning) tank 410, an etching tank 415, a water washing tank 419, a metal layer-forming tank 426, a water washing tank 433, a first zinc oxide film-forming tank 440, a water washing tank 447, a second zinc oxide film forming tank 454 and a water washing tank 461 were disposed. In the respective tanks, conveyance rollers (404, 407, 409, 412, 413, 416, 418, 421–423, 429, 430, 432, 435–437, 443, 444, 446, 449–451, 457, 458, 460 and 463) for controlling a conveyance passage of the sheet substrate 403. The respective water washing tanks (410, 419, 433, 447 and 461), water showers (408, 411, 417, 420, 431, 434, 445, 448, 459 and 462) were provided. The conveyance speed (process speed) of the sheet substrate 403 was set to 20 cm/min. A tension of the sheet substrate 403 was controlled so as to keep a value of 10 kgf by a tension-adjusting clutch incorporated in the wind-up roller 402.

First, the sheet substrate 403 preliminarily coated with an anti-corrosive oil was degreased in the degreasing tank 406 to remove the oil component. The degrease of the oil component was performed at room temperature in an aqueous solution comprising 1 liter of water, 40 ml of sulfuric acid and 70 ml of 37% hydrochloric acid (aqueous solution).

The sheet substrate 403 was conveyed by the conveyance rollers 407 and 409 to the water washing tank 410, where the sheet substrate 403 was sufficiently washed with water by the water showers 408 and 411. At this time, each water for the water showers was supplied at a flow rate of 2 liter/min.

Then, the sheet substrate 403 was conveyed by the conveyance rollers 412 and 413 to the etching tank 415, where the sheet substrate 403 was etched at room temperature with an acid etchant 414 comprising a mixture of 46%-hydrofluoric acid (aqueous solution), nitric acid and acetic acid (3/5/1 by mol).

The sheet substrate 403 was then conveyed to the water washing tank 419 (similar to the above-mentioned water washing tank 410) to be washed with water by the water showers 417 and 420. In this instance, the water may be weak alkaline water since the subsequent metal layer-forming tank 426 employs an alkaline aqueous solution 425.

The thus treated sheet substrate 403 (before the metal layer was formed) had a uneven surface including first linear projections and minute second linear projections of 10 μm in average length and having an Ra(X) of 150 nm and an Ra(Y) of 300 nm as a result of measurement of the average surface roughnesses similarly as in Example 1 and observation with the SEM similarly as in Example 5.

Thereafter, the sheet substrate 403 was conveyed by the conveyance rollers 421–423 to the metal layer-forming tank 426, where a 0.4 μm-thick metal (Cu) layer was formed on the sheet substrate 403 by electroplating under the following conditions:

Electrolytic solution: A mixture aqueous solution of 1 liter of water, 80 g of copper pyrophosphate, 300 g of potassium pyrophosphate, 6 ml of ammonia water specific gravity=0.88), and 10 g of potassium nitrate
Solution temperature: 40–50° C.
Solution pH: 8.2–8.8
Current density: 3 A/dm$^2$
Film-forming rate: 6 nm/sec.
Counter electrode: Cu plate (anode) 424 (connected with a power supply 428 via an electric lead 427)

The film formation was controlled by monitoring and adjusting a current value at the Cu plate (anode) since the sheet substrate 403 was kept at ground potential.

After the thus treated sheet substrate 403 (coated with the metal layer) was then washed in the water washing tank 433, the sheet substrate 403 was conveyed by the conveyance rollers 435–437 to the first zinc oxide film-forming water tank 440, where a 0.15 μm-thick first zinc oxide film comprising hexagonal system-polycrystal having a first crystal particle size and a first crystal orientation was formed.

The first zinc oxide layer-forming tank 440 contained an aqueous (electrolytic) solution 439 comprising 0.05 M of zinc nitrate hexahydrate ($Zn(NO_3)_2.6H_2O$) and 40 g of saccharose in 1 liter of water.

The sheet substrate 403 immersed in the aqueous solution kept at 75° C. and pH=5.9–6.4 was subjected to electrodeposition under the following conditions to form thereon the first zinc oxide film.

Counter electrode 438: buff-polished Zn plate (connected with a power supply 442 via an electric lead 441)
Current density: 0.25 A/dm$^2$
Film-forming rate: 1.5 nm/sec On the first zinc oxide film, a 0.9 μm-thick second zinc oxide film comprising hexagonal system-polycrystal having a second crystal particle size and a second crystal orientation was formed in the second zinc oxide film-forming tank 454 under electrodeposition conditions shown below after washing with water in the washing tank 447.

Electrolytic solution 453 an aqueous solution comprising 1 liter of water, 0.2 M of zinc nitrate hexahydrate and 1 g of dextrin
Solution temperature: 85° C.
pH: 5.2–5.8
Counter electrode 452: buff-polished Zn sheet (connected with a power supply 456 via an electric lead 455)
Current density: 0.45 A/dm$^2$
Film-forming rate: 3.1 nm/sec Thereafter, the thus treated sheet substrate 403 was conveyed by the conveyance rollers 458 and 460 to the water washing tank 461 in which the sheet substrate 403 was washed with the water showers 459 and 462, followed by conveyance to a drying chamber 464 provided with warm air-supplying nozzles (465 and infrared heaters 466 by using the conveyance roller 463. The arm air from the nozzles was kept at 150 ° C. and supplied to the sheet substrate 403 for drying the sheet substrate, thus removing the water remaining on the sheet surface. At this time, the infrared heaters 466 were actuated at 200° C.

After drying the sheet substrate 403, the sheet substrate 403 having thereon the metal layer and the first and second zinc oxide films in this order was wound up (coiled) by the wind-up roller 402.

Incidentally, the aqueous solution in the metal layer-forming tank 426 was stirred or circulated by bubbling (bubble formation with air supply) and the aqueous solutions in the first and second zinc oxide film-forming tanks 440 and 454 were stirred mechanically. Further, pH values of the respective solutions in the metal layer-forming tank and the first and second zinc oxide film-forming tank were respectively monitored by a pH meter including a glass electrode and a temperature-correction mechanism, and were adjusted by supplementing an appropriate amount of ammonia water (for the metal layer-forming tank 426) or zinc nitrate (for the first and second zinc oxide film-forming tanks 440 and 454), thus preparing a sheet substrate for a semiconductor device.

Figure 5:
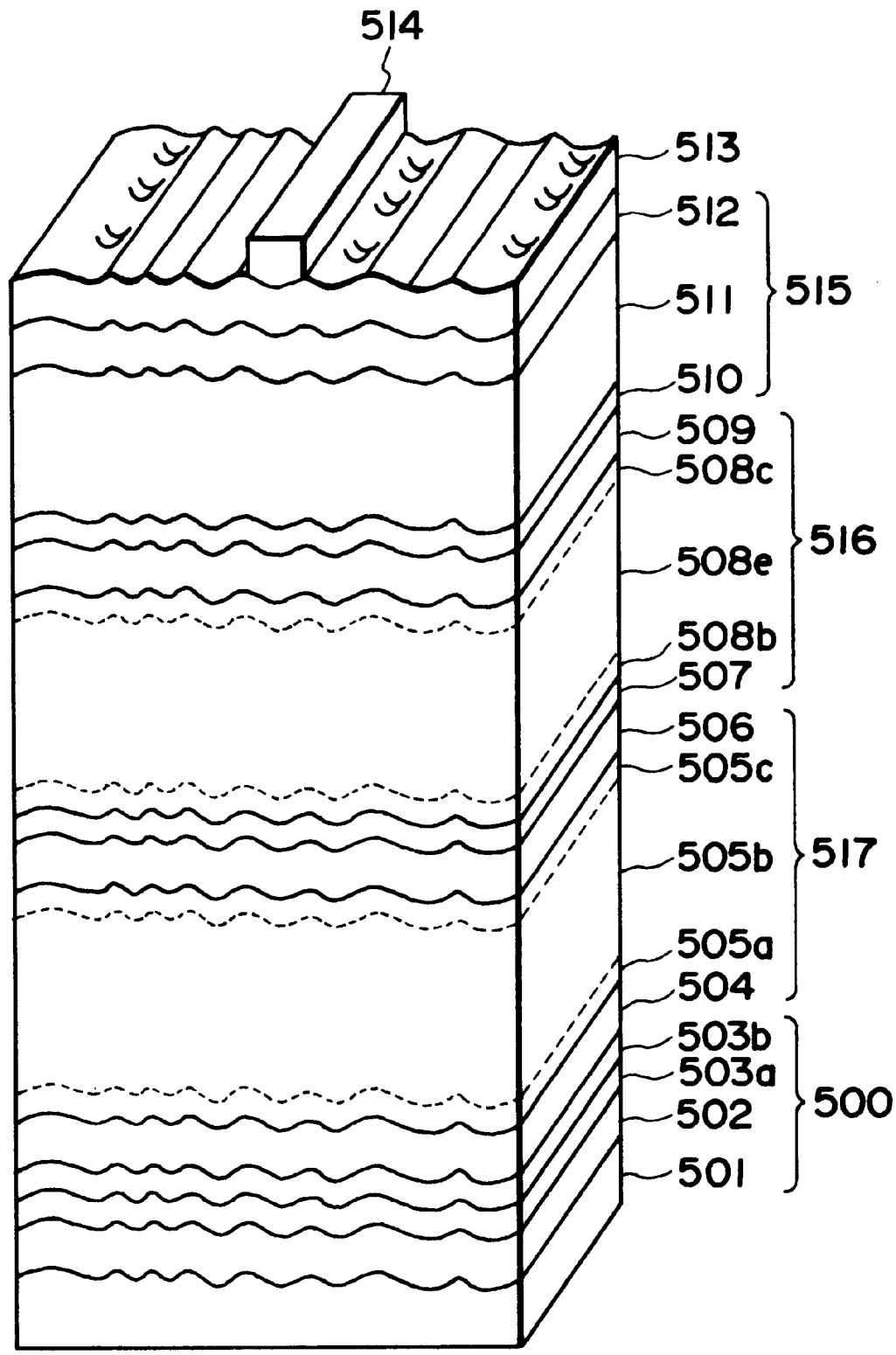
FIG. 5 is a schematic perspective view showing an embodiment of a photo-electricity generating device having a triple cell structure produced through the process of the present invention.

FIG. 5 shows a schematic layer structure of a photo-electricity generating device to be prepared in this example.

The photo-electricity generating device included a substrate 500 for the semiconductor device comprising an electroconductive substrate 501, a metal layer 502, a first zinc oxide film 503a and a second zinc oxide film 503b as formed above.

On the thus prepared second zinc oxide film 503b of the semiconductor device sheet substrate 500, a semiconductor layer having a triple cell structure including a bottom cell 517, a middle cell 516 and a top cell 515 each comprising a pin junction was formed according to a so-called Roll-to-Roll process under conditions shown in Table 2 appearing hereinbelow.

Further, on the p-type layer 512 of the top cell 515 of the semiconductor layer, a 70 nm-thick ITO film 513 was formed by reactive sputtering, followed by passivation treatment wherein the structure was dipped in an aqueous aluminum sulfate solution and was supplied with a voltage to remove an ITO portion of defective portions of the semiconductor layer.

On the thus treated ITO film 513, a collector electrode 514 comprising a 50 μm-thick copper wire having an Ag-clad layer and a carbon layer with a urethane resin binder fixed by heat fusion so that the wire extension direction was substantially perpendicular to the linear projections of the sheet substrate, followed by cutting to obtain five photo-electricity generating devices each of 250×100 mm in size.

The conditions for forming and treating were summarized in Table 2 below.

TABLE 2

| | |
|---|---|
| SUS treatment: | rolling treatment/annealing/acid-washing |
| skinpass rolling: | none |
| surface polishing: | none |
| surface treatment: | annealing: 450–550 |
| backside reflection layer 502: | Cu: 0.4 μm |
| 1st zinc oxide layer 503a: | 0.15 μm |
| 2nd zinc oxide layer 503b: | 0.9 μm |
| bottom cell 517 | |
| n-type layer 504: | a-Si layer, thickness: 20 nm |
| RFi-type layer 505a: | a-Si layer, thickness: 10 nm |
| MWi-type layer 505b: | a-SiGe layer, thickness: 40 nm |
| RFi-type layer 505c: | a-Si layer, thickness: 18 nm |
| p-type layer 506: | μc-Si layer, thickness: 15 nm |
| middle cell 516 | |
| n-type layer 507: | a-Si layer, thickness: 10 nm |
| RFi-type layer 508b: | a-Si layer, thickness: 10 nm |
| MWi-type layer 508e: | a-SiGe layer, thickness: 50 nm |
| RFi-type layer 508c: | a-Si layer, thickness: 18 nm |
| p-type layer 509: | μc-Si layer, thickness: 15 nm |
| top cell 515 | |
| n-type layer 510: | a-Si layer, thickness: 10 nm |
| RFi-type layer 511: | a-Si layer, thickness: 90 nm |
| p-type layer 512: | μc-Si layer, thickness: 10 nm |
| transparent electrode 513: | ITO film, thickness: 70 nm |
| collecting electrode 514: | Cu wire, thickness: 50 μm |

COMPARATIVE EXAMPLE 1

A photo-electricity generating device was prepared in the same manner as in Example 1 except that the BA-finished stainless steel plate (SUS 430) was further subjected to surface treatments with a skinpall rolling mill and by surface polishing for mirror finish and that the etching treatment with the hydrofluoric acid-nitric acid mixture was not effected.

The thus treated stainless steel plate had a glossy surface with no linear projections.

When the stainless steel plate was subjected to measurement of the average surface roughness in the same manner as in Example 1 (before the overlying layers were formed), the glossy surface of the stainless steel plate had an Ra of 10 nm irrespective of measurement directions (X and Y directions).

COMPARATIVE EXAMPLE 2

A photo-electricity generating device was prepared in the same manner as in Example 3 except that the light rolling treatment for the stainless steel plate was changed to a rolling treatment with a roller which surface was mechanically roughened to effect mat finish.

The thus treated stainless steel plate had a uniform uneven surface comprising pyramid-shaped irregularities, with no linear projections, providing an Ra of 700 nm irrespective of measurement directions (as measured in the same manner as in Example 1).

COMPARATIVE EXAMPLE 3

A photo-electricity generating device was prepared in the same manner as in COMPARATIVE EXAMPLE 1 except that the 1 μm-thick zinc oxide film was formed by the DC magnetron sputtering employed in Example 5, instead of the electrodeposition.

COMPARATIVE EXAMPLE 4

A photo-electricity generating device was prepared in the same manner as in Example 5 except that the stainless steel plate was changed to one surface-treated (finished) in the same manner as in COMPARATIVE EXAMPLE 1.

COMPARATIVE EXAMPLE 5

A photo-electricity generating device was prepared in the same manner as in Example 5 except that the stainless steel plate was changed to one surface-treated (finished) in the same manner as in COMPARATIVE EXAMPLE 2.

The stainless steel plate before forming the overlying layers had a uniform uneven surface comprising a triangular pyramid-shaped irregularity.

Further, at the boundary between the 0.1 μm-thick Al layer and the 0.1 μm-thick ZnO layer formed thereon by the DC magnetron sputtering, a remarkable decrease in reflectance was observed. As a result, the resultant photo-electricity generating device caused a lowering in short circuit current (Isc).

COMPARATIVE EXAMPLE 6

The procedures of Example 5 was repeated up to the formation of the metal layer (0.1 μm-thick Al layer) by the DC magnetron sputtering.

On the Al layer, the formation of a zinc oxide film was attempted but no deposited film of zinc oxide was found at the Al layer surface, thus failing to provide a photo-electricity generating device.

COMPARATIVE EXAMPLE 7

A photo-electricity generating device was prepared in the same manner as in Example 7 except that the elongated stainless steel sheet substrate was changed to one surface-treated (finished) in the same manner as in COMPARATIVE EXAMPLE 1, and that the aqueous solution 405 contained in the degreasing tank 406 was changed to that containing an alkaline cleaner (e.g., "LOW HEAT CLEANER 3M" known as "OKAITE" and available from Diafloc Co., Ltd.) and the etchant 414 contained in the etching tank 415 was changed to pure water.

The sheet substrate before forming thereon the overlying layers had a surface with no linear projections and having an Ra of 10 nm irrespective of measured directions.

Evaluation of photoelectricity generating device

Each of the photo-electricity generating devices prepared in Examples 1–7 and Comparative Examples 1–5 and 7 (50×50 mm in size for Examples 1–6 and Comp. Examples 1–5, and 250×100 mm size for Example 7 and Comp. Example 7) was cut into 25 sample devices (125 sample devices in total for each Example or COMPARATIVE EXAMPLE) having an equal size.

Each of the 125 sample devices for each Example or COMPARATIVE EXAMPLE was evaluated with respect to the following evaluation items using an average value of all the sample devices unless otherwise noted specifically.

Yield (%)

In a dark place, a reverse bias voltage of −1.0 V was applied to each sample device to measure a shunt resistance (ohm.$cm_2$).

The yield (%) was determined by obtaining a percentage of the sample devices showing a shunt resistance of at least $3.0 \times 10^4$ ohm.$cm^2$ based on the 125 sample devices.

Initial photoelectric characteristics

With respect to the sample devices showing a shunt resistance of at least $3.0 \times 10^4$ ohm.$cm^2$, each sample device was irradiated with light of an air mass (AM) of 1.5 and an intensity of 100 mW/$cm^2$ at 25° C., where voltage current (V-I) characteristics were measured to obtain initial photoelectric characteristics including a photoelectric conversion efficiency (η), an open circuit voltage (Voc), a short circuit current (Isc) and a fill factor (FF).

Evaluation was effected based on values reactive to those for the sample devices of Comparative Example 1 each taken as "1".

Uniformity of photoelectric conversion efficiency

With respect to the sample devices showing a shunt resistance of at least $3.0 \times 10^4$ ohm.$cm^2$, each average value of the conversion efficiencies (η) was taken as "100".

For the sample devices for each example or comparative Example, a standard deviation was obtained to evaluate as a uniformity of the conversion efficiency.

Adhesive properties

Each sample device was scratched or cut so that two sets of 11 parallel straight lines each with a spacing of 1 mm were drawn and intersected with each other at right angles to provide 100 square regions (each 1×1 mm in size).

Then, a cellophane adhesive tape was sufficiently laminated on the square regions and was instantly peeled therefrom.

The adhesive properties were determined by a percentage (%) of the non-peeled square regions (based on 100 square regions).

Rough cost estimation

For each Example or Comparative Example, a rough cost estimation for forming the associated zinc oxide film(s) was made relative to that for Comparative Example 3 (DC magnetron sputtering) taken as "1".

Photo-deterioration in conversion efficiency

For the sample devices of Example 7 and Comparative Example 7, each sample device was subjected to measurement of the initial photoelectric conversion efficiency (ηinitial) at 25° C. in the above-described manner.

Then, each sample device was irradiated with light of an AM of 1.5 and an intensity of 100 mW/$cm^2$ at 50° C. for 500 hours, followed by measurement of a photoelectric conversion efficiency (η 500) at 25° C. to evaluate a photo-deterioration degree (%) of the photoelectric conversion efficiencies according to the following equation:

Photo-deterioration (%)=[(η initial−η 500)/η initial]×100

Deterioration in conversion efficiency after reverse bias voltage application test in high-temperature and high-humidity environment (referred to as "HHRB test")

Similarly as in the evaluation of photo-deterioration, the initial photoelectric conversion efficiency (η initial) was measured at 25° C.

Then, each sample device was left standing in a dark place for 100 hour under a high-temperature (80° C.) and high-humidity (80%RH) while applying thereto a reverse bias voltage of 0.8 V (HHRB test), followed by measurement of a photoelectric conversion efficiency (η HHRB) at 25° C. to evaluate a deterioration degree (%) of the photoelectric conversion efficiencies after the HHRB test according to the following equation.

Deterioration (%)=[(η initial−η HHRB)/η initial]×100

The evaluation results are shown in Tables 3–5 below.

TABLE 3

(for Examples 1–6)

| Evaluation item | Ex. 1 | Ex. 2 | Ex. 3 | Ex. 4 | Ex. 5 | Ex. 6 |
|---|---|---|---|---|---|---|
| Ra (X) (nm) | 15 | 65 | 300 | 70 | 110 | 200 |
| Ra (Y) (nm) | 20 | 200 | 600 | 100 | 250 | 350 |
| Ra (X)/Ra (Y) | 0.75 | 0.325 | 0.5 | 0.7 | 0.44 | 0.57 |
| Voltage (Voc) | 1.01 | 1.02 | 0.98 | 1.01 | 1.01 | 0.99*[1] |
| Current (Isc) | 1.06 | 1.12 | 1.16 | 1.18 | 1.14 | 1.16*[1] |
| Fill factor (FF) | 1.07 | 1.04 | 1.02 | 1.05 | 1.05 | 1.04*[1] |
| Efficiency (η) | 1.15 | 1.19 | 1.16 | 1.25 | 1.21 | 1.19*[1] |
| Uniformity | 2.5 | 1.8 | 1.5 | 1.4 | 1.2 | 1.0 |
| Yield (%) | 81 | 90 | 83 | 93 | 96 | 94 |
| Adhesive properties (%) | 76 | 87 | 95 | 84 | 89 | 92 |
| Rough cost estimation | 0.1 | 0.1 | 0.1 | 0.05 | 0.2 | 0.1 |

*[1]: These properties were evaluated relative to those for Comparative Example 4, respectively, taken as "1" since Example 6 employed the Al metal layer which provided a reflectance lower than the Ag layer used in Comparative Example 1.

TABLE 4

(for Comparative Examples 1–5)

| Evaluation item | Comp. Ex. 1 | Comp. Ex. 2 | Comp Ex. 3 | Comp. Ex. 4 | Comp. Ex. 5 |
|---|---|---|---|---|---|
| Ra (X) (nm) | 10 | 700 | 10 | 10 | 700 |
| Ra (Y) (nm) | 10 | 700 | 10 | 10 | 700 |
| Ra (X)/Ra (Y) | 1 | 1 | 1 | 1 | 1 |
| Voltage (Voc) | 1 | 0.96 | 1.00 | 1 | 0.96 |
| Current (Isc) | 1 | 1.16 | 1.02 | 1 | 0.95 |
| Fill factor (FF) | 1 | 0.98 | 1.01 | 1 | 0.98 |
| Efficiency (η) | 1 | 1.09 | 1.03 | 1 | 0.89 |
| Uniformity | 5.5 | 1.5 | 2.0 | 5.8 | 1.5 |
| Yield (%) | 65 | 60 | 85 | 60 | 57 |
| Adhesive properties (%) | 62 | 95 | 65 | 58 | 93 |
| Rough cost estimation | 0.1 | 0.1 | 1 | 0.1 | 0.1 |

TABLE 5

(for Example 7 and Comparative Example 7)

| Evaluation item | Ex. 7 | Comp. Ex. 7 |
|---|---|---|
| Ra (X) (nm) | 150 | 10 |
| Ra (Y) (nm) | 300 | 10 |
| Ra (X)/Ra (Y) | 0.5 | 1 |
| Voltage (Voc) | 0.99 | 1 |
| Current (Isc) | 1.15 | 1 |
| Fill factor (FF) | 1.06 | 1 |
| Efficiency (η) | 1.21 | 1 |
| Uniformity | 0.9 | 4.8 |
| Yield (%) | 97 | 72 |
| Adhesive properties (%) | 90 | 59 |
| Photo-deterioration (%) | 14 | 19 |
| HHRB deterioration (%) | 4 | 22 |

EXAMPLE 8

Twelve sandwiched-type optical sensors (each 8×215 mm in size) were each prepared in the following manner.

The procedures of Example 1 were repeated up to the formation of the ITO film (transparent electrode) except that the-BA-finished stainless steel plate (50×50 mm) was changed to the 2D-finished stainless steel plate (50×50 mm) and that the i-type semiconductor layer was changed to a 0.8 μm-thick i-type layer of a-Si.

The thus obtained structure was cut to obtain five elongated portions each of 8×43 mm in size, followed by formation of Al electrode at 8 bits/mm and series connection thereof in their lengthwise (elongated) directions.

The thus connected structure of the elongated portions was provided with a cover glass to prepare a contact-type optical sensor of 8×215 mm in size.

Each of the 12 optical sensors thus prepared was irradiated with light (green fluorescent lamp; 100 lux) under application of a voltage of −5 V to measure a photocurrent.

Based on a dark current separately measured, an average current ratio of the photocurrent/the dark current was obtained to determine a yield (%) as a percentage of the bits providing a current ratio of at least $1.0 \times 10^3$ based on all the bits.

Based on logarithms of the current ratios for each optical sensor, a standard deviation thereof was determined to evaluate a uniformity.

The results are shown in Table 6 appearing hereinafter.

Further, the 12 optical sensors were subjected to measurement of spectral sensitivity to show a good sensitivity (i.e., average current ratio) to a long wavelength light (e.g., at least 600 nm), thus facilitating the provision of a color-type optical sensor.

In this example, the zinc oxide film-forming cost was roughly 1/10 that for the sputtering process.

COMPARATIVE EXAMPLE 8

Twelve optical sensors were prepared and evaluated in the same manner as in Example 8 except that a stainless steel plate surface-treated (finished) in the same manner as in Comparative Example 1 was used instead of the 2D-finished stainless steel plate.

The results are shown in Table 6 below.

TABLE 6

| Evaluation time | Ex. 8 | Comp. Ex. 8 |
|---|---|---|
| Yield (%) | 91 | 72 |
| Current ratio | $8.0 \times 10^3$ | $2.5 \times 10^3$ |
| Uniformity | 0.08 | 0.20 |

When the 12 optical sensors were subjected to measurement of spectral sensitivity, the optical sensors showed a lower sensitivity to the long wavelength light compared with those of Example 8.

As described hereinabove, according to the processes of the present invention, the formation of the zinc oxide film can be effected in the liquid-phase deposition, thus reducing the production costs of the semiconductor device substrate and photo-electricity generating device using the zinc oxide film when compared with the conventional vacuum deposition (sputtering) process.

In comparison with the conventional electroconductive substrate (stainless steel substrate) having a substantially even or flat surface, the electroconductive substrate (stainless steel substrate) used in the present invention has an appropriate uneven surface including linear projections, thus improving adhesive properties between the electroconductive substrate and the zinc oxide film formed thereon to suppress the peeling-off of the zinc oxide film in the production process of a photo-electricity generating device. As a result, a controllability and latitude for respective production steps are improved, thus improving the production yield, weathering resistance and durability of the resultant photo-electricity generating device.

The use of the electroconductive substrate having the uneven surface including linear projections also allows an increase in irregular (diffuse) reflectance at the back side of the photo-electricity generating device, whereby the long wavelength light remained without being absorbed by the semiconductor layer is effectively scattered into the semiconductor layer to prolong the optical path length within the semiconductor layer, thus increasing the short circuit current (Isc) to improve the photoelectric conversion efficiency.

Further, the series resistance of the photo-electricity generating device is also decreased, thus increasing the fill factor (FF) to improve the conversion efficiency.

This may be attributable to the improvement in adhesive properties (between the electroconductive substrate and the zinc oxide film formed thereon), the removals of the impurities at the surface of the electroconductive substrate by the surface treatment and of the oxide layer of the electroconductive substrate.

According to the present invention, a degree of photo-deterioration occurred in the photo-electricity generating device using a semiconductor layer of an amorphous silicon semiconductor material, particularly a stacked-type semiconductor layer including plural pin junctions, can effectively be suppressed.

This may be attributable to an increase in the entire short circuit current (Isc) of the photo-electricity generating device capable of allowing a latitude in short circuit current (Isc) caused at the pin junction remoter from the incident light side, thus improving a current balance of the respective pin junctions.

In comparison with the flat surface of the electroconductive substrate, the uneven surface of the electroconductive substrate used in the present invention enlarges an average crystal particle size of the zinc oxide film formed thereon, thus promoting scattering of light to increase the Isc.

According to the present invention, uniformities of the zinc oxide film properties (thickness, electroconductivity, crystal orientation, etc.) are improved over the entire film-forming area, thus resulting in an improved uniformity of photoelectric characteristics to improve the production yield of the photo-electricity generating device.

According to the present invention, it is also possible to remarkably suppress the anomalous growth of the zinc oxide film, thus leading to suppression or minimization of the shunt phenomenon and the formation of defects of the photo-electricity generating device to decrease a leakage current and increase the production yield.

The above advantages obtained by using the electroconductive substrate having the uneven substrate including linear projections (as shown in FIGS. 1A–1D) in comparison with the use of the conventional flat electroconductive substrate may be attributable to a uniformized nucleus-forming density for the crystal growth of the zinc oxide film at the initial crystal-growth stage in the liquid-phase deposition, thus uniformizing the crystal growth of the zinc oxide film and to the suppression of an anomalous growth at a local portion due to the uniformized nucleus-forming density.

Different from a conventional pyramid-shaped uneven surface including a plurality of apexes, the electroconductive substrate used in the present invention has a moderate uneven surface including a plurality of linear projections, thus weakening a concentration of an applied electric field to minimize an occurrence of defective portions of the semiconductor layer. Further, such a pyramid-shaped uneven surface (relatively rough surface) of the electroconductive substrate makes an effective thickness of the overlying semiconductor layer thinner than that of an electroconductive substrate with a mirror surface, so that, e.g., a doping layer of the semiconductor layer to be designed thin becomes thinner, thus lowering the resultant open circuit voltage (Voc) and fill factor (FF) in some cases. In the present invention, the uneven surface of the electroconductive substrate has a surface area smaller than the pyramid-shaped uneven surface, thus decreasing a degree of a decrease in thickness of the semiconductor layer and ensuring light scattering at boundaries among polycrystalline particles. As a result, it become possible to increase the Voc and the FF while maintaining a higher Isc.

The addition of the carbohydrate in the aqueous solution used in the present invention improves a uniformity of the film properties of the zinc oxide film (e.g., thickness, electroconductivity, crystal particle size and crystal orientation) within the entire film-forming region and also allows prevention of the occurrence of anomalous growth of the zinc oxide crystal, thus resulting in a high production yield of the photo-electricity generating device. Further, it becomes also possible to readily provide desired film properties described above, thus enlarging a range of liquid-phase deposition conditions capable of providing desired characteristics to improve controllability of the zinc oxide film formation. In addition, when the zinc oxide film is formed by the liquid-phase deposition, an amount of a powdery substance deposited or precipitated at a bottom portion of the tank used can be decreased to improve maintenance properties of the liquid-phase deposition apparatus.

What is claimed is:

1. A process for forming a zinc oxide film, comprising: immersing an electroconductive substrate having a surface including a plurality of patterned linear projections wherein the patterned linear projection are formed by rolling or polishing in an aqueous solution containing at least nitrate ions and zinc ions to form a zinc oxide film on the electroconductive substrate by a liquid-phase deposition.

2. A process according to claim 1, wherein the plurality of patterned linear projections provide an uneven surface which has a center-line average surface roughness Ra(X) of 15–300 nm when scanned in a direction parallel to the patterned linear projections, a center line average surface roughness Ra(Y) of 20–600 nm when scanned in a direction perpendicular to the patterned linear projections, and an Ra(X)/Ra(Y) ratio of at most 0.8.

3. A process according to claim 1, wherein the patterned linear projections comprise first patterned linear projections and second patterned linear projections arranged in different directions.

4. A process according to claim 3, wherein each of the second patterned linear projections has a length of at most 20 μm.

5. A process according to claim 1, wherein the patterned linear projections are arranged in a straight-line shape, a curved shape or a spiral shape.

6. A process according to claim 1, wherein the patterned linear projections have a pitch of 0.5–20 μm between adjacent patterned linear projections.

7. A process according to claim 1, wherein the electroconductive substrate comprises a metallic material, a metallic material coated with another metallic material or a resinous material coated with an electroconductive substance.

8. A process according to claim 7, wherein said metallic material is selected from the group consisting of Fe, Ni, Cr, Al, Mo, Au, Nb, Ta, V, Ti, Pt, Pb and alloys of these metals.

9. A process according to claim 7, wherein said another metallic material is selected from the group consisting of Al, Ag, Pt, Au, Ni, Ti, Mo, W, Fe, V, Cr, Cu, stainless steel, brass and a nickel-chromium alloy.

10. A process according to claim 1, further including an etching step and/or an annealing step of the electroconductive substrate.

11. A process according to claim 1, wherein the liquid-phase deposition comprises electrodeposition.

12. A process according to claim 11, wherein the aqueous solution contains a carbohydrate.

13. A process according to claim 1, wherein the liquid-phase deposition comprises electroless deposition.

14. A process according to claim 1, wherein the zinc oxide film comprises a first zinc oxide film formed by electroless deposition and a second zinc oxide film formed by electrodeposition.

15. A process according to claim 1, wherein the electroconductive substrate comprises an elongated electroconductive sheet substrate, said process further comprising a step of feeding the sheet substrate and a step of winding up the sheet substrate in a coil shape after forming the zinc oxide film on the sheet substrate.

16. A process for producing a substrate, for a semiconductor device, comprising an electroconductive substrate and a zinc oxide film formed thereon, said process comprising:

immersing an electroconductive substrate having a surface including a plurality of patterned linear projections wherein the patterned linear projection are formed by rolling or polishing in an aqueous solution containing at least nitrate ions and zinc ions to form a zinc oxide film on the electroconductive substrate by a liquid-phase deposition.

17. A process according to claim 16, wherein the plurality of patterned linear projections provide an uneven surface which has a center-line average surface roughness Ra(X) of 15–300 nm when scanned in a direction parallel to the patterned linear projections, a center line average surface roughness Ra(Y) of 20–600 nm when scanned in a direction perpendicular to the patterned linear projections, and an Ra(X)/Ra(Y) ratio of at most 0.8.

18. A process according to claim 16, wherein the patterned linear projections comprise first patterned linear projections and second patterned linear projections arranged in different directions.

19. A process according to claim 18, wherein each of the second patterned linear projections has a length of at most 20 µm.

20. A process according to claim 16, wherein the patterned linear projections are arranged in a straight-line shape, a curved shape or a spiral shape.

21. A process according to claim 16, wherein the patterned linear projections have a pitch of 0.5–20 µm between adjacent patterned linear projections.

22. A process according to claim 16, wherein the electroconductive substrate comprises a metallic material, a metallic material coated with another metallic material or a resinous material coated with an electroconductive substance.

23. A process according to claim 22, wherein said metallic material is selected from the group consisting of Fe, Ni, Cr, Al, Mo, Au, Nb, Ta, V, Ti, Pt, Pb and alloys of these metals.

24. A process according to claim 22, wherein said another metallic material is selected from the group consisting of Al, Ag, Pt, Au, Ni, Ti, Mo, W, Fe, V, Cr, Cu, stainless steel, brass and a nickel-chromium alloy.

25. A process according to claim 16, further including an etching step and/or an annealing step of the electroconductive substrate.

26. A process according to claim 16, wherein the liquid-phase deposition comprises electrodeposition.

27. A process according to claim 26, wherein the aqueous solution contains a carbohydrate.

28. A process according to claim 16, wherein the liquid-phase deposition comprises electroless deposition.

29. A process according to claim 16, wherein the zinc oxide film comprises a first zinc oxide film formed by electroless deposition and a second zinc oxide film formed by electrodeposition.

30. A process according to claim 16, wherein the electroconductive substrate comprises an elongated electroconductive sheet substrate, said process further comprising a step of feeding the sheet substrate and a step of winding up the sheet substrate in a coil shape after forming the zinc oxide film on the sheet substrate.

31. A process for producing a photo-electricity generating device, comprising:

forming a zinc oxide film on an electroconductive substrate by immersing the electroconductive substrate having a surface including a plurality of patterned linear projections wherein the patterned linear projection are formed by rolling or polishing in an aqueous solution containing at least nitrate ions and zinc ions to form a zinc oxide film on the electroconductive substrate by a liquid-phase deposition; and forming a semiconductor layer on the zinc oxide film to produce the photoelectricity generating device.

32. A process according to claim 31, wherein the plurality of patterned linear projections provide an uneven surface which has a center-line average surface roughness Ra(X) of 15–300 nm when scanned in a direction parallel to the patterned linear projections, a center line average surface roughness Ra(Y) of 20–600 nm when scanned in a direction perpendicular to the patterned linear projections, and an Ra(X)/Ra(Y) ratio of at most 0.8.

33. A process according to claim 31, wherein the patterned linear projections comprise first patterned linear projections and second patterned linear projections arranged in different directions.

34. A process according to claim 33, wherein each of the second patterned linear projections has a length of at most 20 µm.

35. A process according to claim 31, wherein the patterned linear projections are arranged in a straight-line shape, a curved shape or a spiral shape.

36. A process according to claim 31, wherein the patterned linear projections have a pitch of 0.5–20 µm between adjacent patterned linear projections.

37. A process according to claim 31, wherein the electroconductive substrate comprises a metallic material, a metallic material coated with another metallic material or a resinous material coated with an electroconductive substance.

38. A process according to claim 37, wherein said metallic material is selected from the group consisting of Fe, Ni, Cr, Al, Mo, Au, Nb, Ta, V, Ti, Pt, Pb and alloys of these metals.

39. A process according to claim 37, wherein said another metallic material is selected from the group consisting of Al, Ag, Pt, Au, Ni, Ti, Mo, W, Fe, V, Cr, Cu, stainless steel, brass and a nickel-chromium alloy.

40. A process according to claim 31, further including an etching step and/or an annealing step of the electroconductive substrate.

41. A process according to claim 31, wherein the liquid-phase deposition comprises electrodeposition.

42. A process according to claim 41, wherein the aqueous solution contains a carbohydrate.

43. A process according to claim 31, wherein the liquid-phase deposition comprises electroless deposition.

44. A process according to claim 31, wherein the zinc oxide film comprises a first zinc oxide film formed by electroless deposition and a second zinc oxide film formed by electrodeposition.

45. A process according to claim 31, wherein the electroconductive substrate comprises an elongated electroconductive sheet substrate, said process further comprising a step of feeding the sheet substrate and a step of winding up the sheet substrate in a coil shape after forming the zinc oxide film on the sheet substrate.

46. A process according to claim 31, wherein the semiconductor layer comprises a non-single crystalline material and has at least one pin junction.

47. A process according to claim 46, wherein the semiconductor layer comprises a plurality of pin junction layers each comprising a non-single crystalline material.

48. A process according to claim 31, wherein the semiconductor layer has an uneven surface corresponding to the surface of the electroconductive substrate including the patterned linear projections.

49. A process according to claim 31, wherein the photo-electricity generating device includes a collector electrode arranged substantially perpendicular to the patterned linear projections.

* * * * *

UNITED STATES PATENT AND TRADEMARK OFFICE
CERTIFICATE OF CORRECTION

PATENT NO. : 6,106,689
DATED : August 33, 2000
INVENTOR(S) : Jinsho Matsuyama

It is certified that error appears in the above-identified patent and that said Letters Patent is hereby corrected as shown below:

COLUMN 1:

Line 13, "an" should read --a--;
Line 17, "an" should read --a--;
Line 23, "that" should read --so that--; and
Line 39, "there have" should read --it has--.

COLUMN 2:

Line 12, "an" should read --a--; and
Line 59, "an" should read --a--.

COLUMN 3:

Line 32, "is corresponding" should read --corresponds--;
Line 64, "be" should read --been--; and
Line 66, "have" should read --has--.

COLUMN 5:

Line 29, "polyvinyliene: should read --polyvinylidene--.

COLUMN 6:

Line 18, "or irradiated" should read --or is irradiated--;
Line 33, "by" should read --in--;
Line 34, "but" should read --but there--; and
Line 52, "substrate by" should read --substrate can be achieved by--.

UNITED STATES PATENT AND TRADEMARK OFFICE
CERTIFICATE OF CORRECTION

PATENT NO.   : 6,106,689
DATED        : August 22, 2000
INVENTOR(S)  : Jinsho Matsuyama It is certified that error appears in the above-identified patent and that said Letters Patent is hereby corrected as shown below:

COLUMN 7:

Line 14, "followed subjected" should read --followed by being subjected--;
Line 17, "by means a" should read --by means of a--;
Line 23, "jecting" should read --jecting them--; and "mill" should read --mill,--; and
Line 35, "surface into" should read --surface, to place the stainless steel into--.

COLUMN 8:

Line 1, "enables" should be deleted;
Line 5, "to-Ra(L)" should read --Ra(L) is --;
Line 8, "obtained" should read --is obtained--;
Line 9, "roll Ra(L) may be" should read --roll, the Ra(L) may preferably be in --;
Line 10, "preferably be in" should be deleted;
Line 23, "layer" should read --later--; and
Line 64, "show" should read --shown--.

COLUMN 9:

Line 30, "preferab;e" should read --preferably--.

COLUMN 10:

Line 15, "and" should read --are--; and
        "plurality" should read --plurality of --; and
Line 64, "are failed" should read --fail--.

UNITED STATES PATENT AND TRADEMARK OFFICE
CERTIFICATE OF CORRECTION

PATENT NO. : 6,106,689
DATED : August 22, 2000
INVENTOR(S) : Jinsho Matsuyama

It is certified that error appears in the above-identified patent and that said Letters Patent is hereby corrected as shown below:

COLUMN 12:

Line 8, "hydrazinc," should read --hydrazine,--; and
    Line 47, "is." should read --is--.

COLUMN 13:

Line 37, "oxide 303" should read --oxide film 303--;
    Line 41, "layer 305" should read --layer 306--; and
    Line 46, "suitable" should read --suitably--.

COLUMN 14:

Line 52, "GIIz" should read --GHz--;
    Line 61, "layer" should read --layers--; and
    Line 65, "GeII$_4$." should read --GeH$_4$.--.

COLUMN 15:

Line 30, "consequent," should read --consequence,--.

COLUMN 16:

Line 6, "layer) by" should read --layer) is formed by--; and
    Line 29, "an" (first occurrence) should read --a--.

COLUMN 17:

Table 1, "Al:1μm" should read --A1: m--;
    Table 1, "Si$_2$II$_6$:" should read --Si$_2$H$_6$:--; and
        "II$_2$" should read --H$_2$--;

UNITED STATES PATENT AND TRADEMARK OFFICE
CERTIFICATE OF CORRECTION

PATENT NO. : 6,106,689
DATED : August 22, 2000
INVENTOR(S) : Jinsho Matsuyama

It is certified that error appears in the above-identified patent and that said Letters Patent is hereby corrected as shown below:

COLUMN 17: (cont.)

Table 1, "Ildrogen" should read --Hydrogen-- and IL$_2$" should read --H$_2$--;
Table 1, "SIH$_1$" should read --SiH$_4$--;
Table 1, "Cr(100 nm)/Ag" should read --Cr(100 nm/Ag--; and
ine 59, "BA " should read --BA--.

COLUMN 18:

Line 48, "as" should read --was--; and
Line 67, "an" should read --a--.

COLUMN 19:

Line 1, "8um" should read --8 µm--;
Line 3, "a" should read --an--;
Line 16, " A1" should read --A1--; and
Line 45, "a" should read --an--.

COLUMN 21:

Line 3, "463) for" should read --463) are provided for--; and
"a conveyance passage" should read --conveyance--;
Line 13, "degrease" should read --degreasing--;
Line 49, "specific" should read --specific--; and
Line 51, pII:" should read --pH:--.

UNITED STATES PATENT AND TRADEMARK OFFICE
CERTIFICATE OF CORRECTION

PATENT NO.   : 6,106,689
DATED        : August 22, 2000
INVENTOR(S)  : Jinsho Matsuyama It is certified that error appears in the above-identified patent and that said Letters Patent is hereby corrected as shown below:

COLUMN 22:

Line 32, "(465" should read --465--; and
Line 33, "arm" should read --warm--.

COLUMN 23:

Line 10, "binder fixed" should read --binder was fixed--; and
Line 13, "substrate, followed by cutting should read
         --substrate. This structure was then cut--.

COLUMN 24:

Line 10, "mat" should read --matte--;
Line 40, " Λ1" should read --Al--; and
Line 48, "was" should read --were--.

COLUMN 25:

Line 20, "(ohm.cm2)" should read --ohm.cm$^2$)--;
Line 40, "comparative" should read --Comparative--; and
Line 63, "(ηinitial)" should read --(η initial)--.

COLUMN 26:

Line 12, "hour" should read --hours--; and
Table 4, "item" should read --item--.
         item

UNITED STATES PATENT AND TRADEMARK OFFICE
CERTIFICATE OF CORRECTION

PATENT NO. : 6,106,689
DATED : August 22, 2000
INVENTOR(S) : Jinsho Matsuyama

It is certified that error appears in the above-identified patent and that said Letters Patent is hereby corrected as shown below:

COLUMN 27:

Line 28, "the-BA-finished" should read --the BA-finished--; and
Line 59, "1/10that" should read 1/10 that--.

COLUMN 28:

Line 14, "s" should read --As--; and
Line 55, "occurred" should read --occurring--.

COLUMN 30:

Line 5, "projection" shuld read --projections--.

UNITED STATES PATENT AND TRADEMARK OFFICE
CERTIFICATE OF CORRECTION

PATENT NO. : 6,106,689
DATED : August 22, 2000
INVENTOR(S) : Jinsho Matsuyama

It is certified that error appears in the above-identified patent and that said Letters Patent is hereby corrected as shown below:

COLUMN 31:

Line 1, "projection" should read --projections--; and
Line 61, "tion" should read --tions--.

Signed and Sealed this

Twelfth Day of June, 2001

Attest:

Attesting Officer

NICHOLAS P. GODICI
Acting Director of the United States Patent and Trademark Office